(12) United States Patent
Uchida et al.

(10) Patent No.: US 10,818,591 B2
(45) Date of Patent: Oct. 27, 2020

(54) SEMICONDUCTOR DEVICE WITH INDUCTIVE COUPLING AND METHOD OF MANUFACTURING THE SAME

(71) Applicant: Renesas Electronics Corporation, Tokyo (JP)

(72) Inventors: Shinichi Uchida, Tokyo (JP); Yasutaka Nakashiba, Ibaraki (JP); Tetsuya Iida, Ibaraki (JP); Shinichi Kuwabara, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/953,872

(22) Filed: Apr. 16, 2018

(65) Prior Publication Data
US 2018/0308795 A1 Oct. 25, 2018

(30) Foreign Application Priority Data
Apr. 20, 2017 (JP) .................. 2017-083715

(51) Int. Cl.
| | | |
|---|---|---|
| *H01L 23/522* | (2006.01) | |
| *H01L 23/528* | (2006.01) | |
| *H01L 49/02* | (2006.01) | |
| *H01L 21/768* | (2006.01) | |
| *H01L 21/3213* | (2006.01) | |
| *H01L 25/065* | (2006.01) | |
| *H01L 23/532* | (2006.01) | |
| *H04B 5/00* | (2006.01) | |

(52) U.S. Cl.
CPC .... *H01L 23/5227* (2013.01); *H01L 21/32139* (2013.01); *H01L 21/76802* (2013.01); *H01L 21/76819* (2013.01); *H01L 23/528* (2013.01); *H01L 23/5283* (2013.01); *H01L 23/53295* (2013.01); *H01L 25/0657* (2013.01); *H01L 28/10* (2013.01); *H04B 5/0075* (2013.01)

(58) Field of Classification Search
CPC ............... H01L 23/5227; H01L 23/528; H01L 23/5283; H01L 23/53295; H01L 28/10
USPC ......................... 257/531, 758, 760
See application file for complete search history.

(56) References Cited

U.S. PATENT DOCUMENTS

| | | | | |
|---|---|---|---|---|
| 7,474,002 B2* | 1/2009 | Ishikawa | ........... | G02F 1/136227 257/306 |
| 8,089,155 B2* | 1/2012 | Lin | ....... | H01L 23/522 257/758 |
| 2007/0164434 A1* | 7/2007 | Watanabe | ........... | H01L 23/5223 257/758 |
| 2010/0213615 A1* | 8/2010 | Nagasaki | ............ | H01L 23/5283 257/773 |
| 2016/0027732 A1* | 1/2016 | Igarashi | .................. | H01L 24/49 257/531 |
| 2018/0130587 A1* | 5/2018 | Tanaka | .................... | H01F 5/003 |

FOREIGN PATENT DOCUMENTS

JP         2014-22600 A      2/2014

* cited by examiner

*Primary Examiner* — Matthew E Warren
(74) *Attorney, Agent, or Firm* — Sughrue Mion, PLLC

(57) ABSTRACT

A method of manufacturing a semiconductor device includes a step of: patterning a conductive film formed over an interlayer insulating film so as to form a coil and a conductive pattern in the same layer, and then forming unevennesses on a surface of the interlayer insulating film by etching a portion of the interlayer insulating film with using the coil and the conductive pattern as a mask.

18 Claims, 21 Drawing Sheets

SEMICONDUCTOR DEVICE WITH INDUCTIVE COUPLING AND METHOD OF MANUFACTURING THE SAME

CROSS-REFERENCE TO RELATED APPLICATION

The present application claims priority from Japanese Patent Application No. 2017-083715 filed on Apr. 20, 2017, the content of which is hereby incorporated by reference into this application.

TECHNICAL FIELD OF THE INVENTION

The present invention relates to a semiconductor device and a manufacturing technique of the same, and relates to a technique effectively applied to, for example, a semiconductor device that allows signal transmission between different potentials by using a pair of inductors inductively coupled to each other, and a manufacturing technique of the same.

BACKGROUND OF THE INVENTION

Japanese Patent Application Laid-open Publication No. 2014-22600 (Patent Document 1) has described a technique in which a creepage withstand voltage can be improved without increasing an overall area occupied by an isolator that includes an insulating region. Specifically, Patent Document 1 has described a technique in which a creepage distance is elongated by forming unevennesses between insulating layers stacked on each other to improve the creepage withstand voltage.

SUMMARY OF THE INVENTION

For example, there is a transformer (micro-isolator) that allows signal transmission without electrical contact by using a pair of inductors inductively coupled to each other. According to this transformer, since signal transmission is allowed without being in an electrically contacting state, it is advantageous in that electrical noise from one circuit can be suppressed from causing an adverse effect on another circuit. Further, in the transformer configured as described above, it is desired to improve the withstand voltage to allow signal transmission without electrical contact between circuits having potentials that significantly differ from each other.

Other problems and novel features will be apparent from the description in the present specification and the attached drawings.

A method of manufacturing a semiconductor device according to one embodiment of the present invention includes a step of: patterning a conductive film formed over an interlayer insulating film so as to form an inductor and a conductive pattern in the same layer, and then forming unevennesses on a surface of the interlayer insulating film by etching a portion of the interlayer insulating film with using the inductor and the conductive pattern as a mask.

According to the above-described embodiment, a withstand voltage of a transformer can be improved without complicating the manufacturing process.

BRIEF DESCRIPTIONS OF THE DRAWINGS

DESCRIPTIONS OF THE PREFERRED EMBODIMENTS

Figure 1:
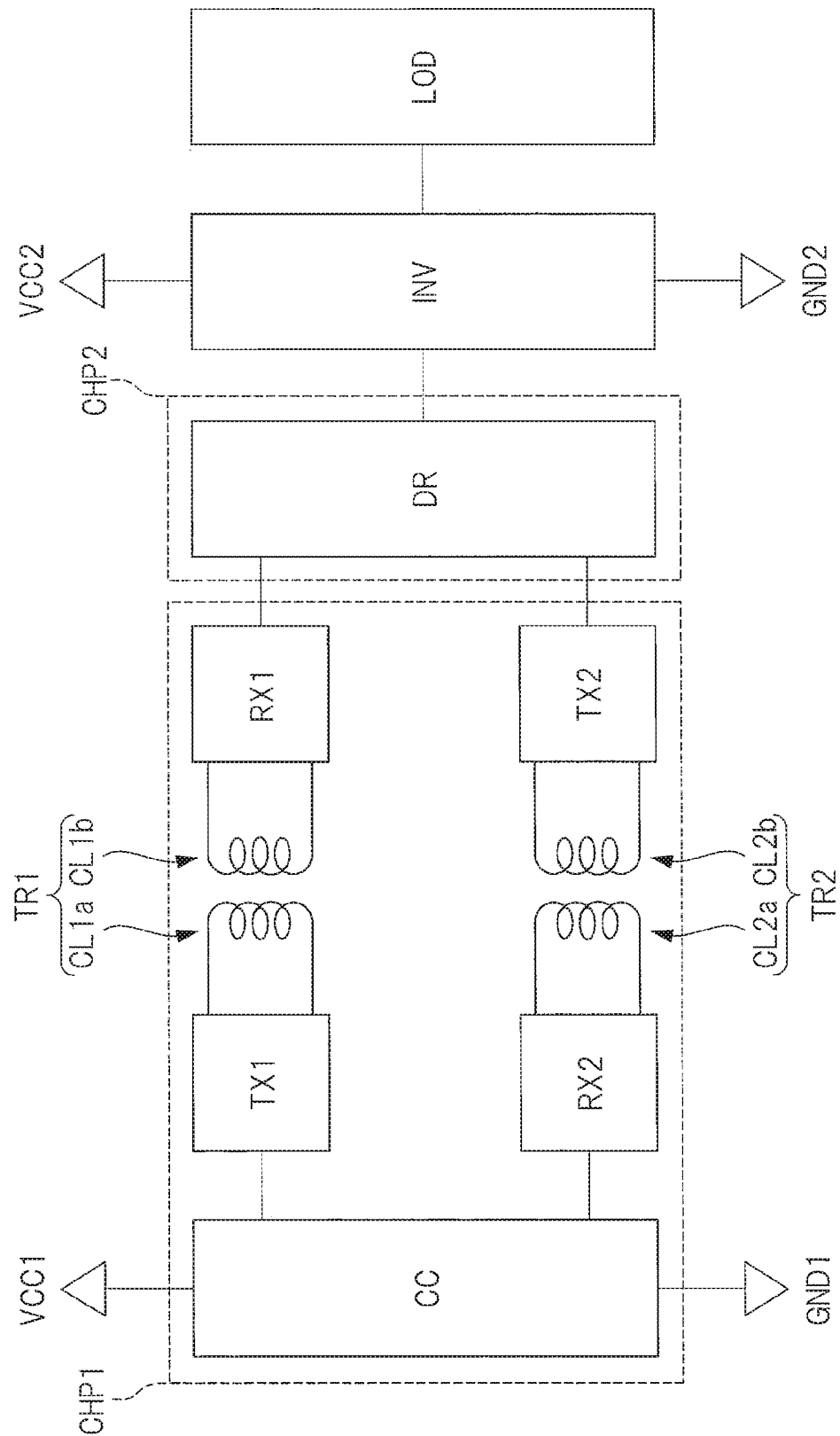
FIG. 1 is a diagram showing a configuration example of a drive control unit that drives a load.

In the embodiments described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description, or the like.

In addition, in the embodiments described below, when referring to the number of a component (including number of pieces, numerical value, amount, and range), the number is not limited to a specified number and may be less than or greater than this number, unless otherwise clearly specified or unless it is obvious from the context that the number is limited to the specified number in principle.

Furthermore, in the embodiments described below, it goes without saying that each component (including an element step) is not indispensable unless otherwise clearly specified or unless it is obvious from the context that the component is indispensable in principle.

Likewise, in the embodiments described below, when referring to a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

In addition, in all of the drawings that describe the embodiments, the same members are generally denoted by the same reference symbols, and redundant descriptions thereof are omitted as appropriate. Note that, in order to easily view the drawings, hatched lines or stippled dots are occasionally used even if the drawing is a plan view.

First Embodiment

<Circuit Configuration>

FIG. 1 is a diagram showing a configuration example of a drive control unit that drives a load such as a motor. As shown in FIG. 1, the drive control unit according to a first embodiment of the present invention includes a control circuit CC, a transformer TR1, a transformer TR2, a drive circuit DR, and an inverter INV, and the drive control unit is electrically connected with a load LOD. In particular, as shown in FIG. 1, the control circuit CC, the transformer TR1 and the transformer TR2 are formed within a semiconductor chip CHP1, and the drive circuit DR is formed within a semiconductor chip CHP2 in the first embodiment.

Specifically, as shown in FIG. 1, the control circuit CC is formed, for example, within the semiconductor chip CHP1, along with a transmission circuit TX1, a reception circuit RX1, a reception circuit RX2, and a transmission circuit TX2. On the other hand, as shown in FIG. 1, the drive circuit DR is formed within the semiconductor chip CHP2.

The transmission circuit TX1 and the reception circuit RX1 are circuits for transmitting a control signal outputted from the control circuit CC to the drive circuit DR. On the other hand, the transmission circuit TX2 and the reception circuit RX2 are circuits for transmitting a signal outputted from the drive circuit DR to the control circuit CC. The control circuit CC is a circuit that functions to control the drive circuit DR, and the drive circuit DR is a circuit that actuates the inverter INV controlling the load LOD in accordance with controls of the control circuit CC.

A power-supply potential VCC1 is supplied to the circuits within the semiconductor chip CHP1 that includes the transmission circuits TX1 and TX2 and the reception circuits RX1 and RX2, and the semiconductor chip CHP1 is grounded through a ground potential GND1. On the other hand, a power-supply potential VCC2 is supplied to the inverter INV, and the inverter INV is grounded through a ground potential GND2. At this time, for example, the power-supply potential VCC1 supplied to the semiconductor chip CHP1 is set to be less than the power-supply potential VCC2 supplied to the inverter INV. In other words, the power-supply potential VCC2 supplied to the inverter INV is set to be greater than the power-supply potential VCC1 supplied to the semiconductor chip CHP1.

The transformer TR1 constituted by a coil (inductor) CL1$a$ and a coil CL1$b$ inductively coupled (magnetically coupled) to each other is disposed between the transmission circuit TX1 and the reception circuit RX1. Hence, in the first embodiment, the signal can be transmitted from the transmission circuit TX1 to the reception circuit RX1 via the transformer TR1. As a result, the drive circuit DR formed within the semiconductor chip CHP2 can receive the control signal outputted from the control circuit CC formed within the semiconductor chip CHP1 via the transformer TR1.

In this manner, in the first embodiment, the control signal can be transmitted from the control circuit CC to the drive circuit DR by using inductive coupling via the electrically insulated transformer TR1, and thus, the control signal can be transmitted while suppressing the transmission of electrical noise from the control circuit CC to the drive circuit DR. Hence, according to the first embodiment, malfunction of the drive circuit DR caused by electrical noise superimposed on the control signal can be suppressed, and therefore, operation reliability of the semiconductor device can be improved.

In the first embodiment, the coil CL1$a$ and the coil CL1$b$ constituting the transformer TR1 are both formed within the semiconductor chip CHP1. In other words, the transformer TR1 is constituted by the coil CL1$a$ and the coil CL1$b$ formed within the semiconductor chip CHP1. The coil CL1$a$ and the coil CL1$b$ each function as an inductor, and the transformer TR1 functions as a magnetically coupled element that is constituted by the coil CL1$a$ and the coil CL1$b$ inductively coupled to each other.

Likewise, the transformer TR2 constituted by a coil CL2$b$ and a coil CL2$a$ inductively coupled to each other is disposed between the transmission circuit TX2 and the reception circuit RX2. Hence, in the first embodiment, the signal can be transmitted from the transmission circuit TX2 to the reception circuit RX2 via the transformer TR2. As a result, the control circuit CC formed within the semiconductor chip CHP1 can receive the signal outputted from the drive circuit DR formed within the semiconductor chip CHP2 via the transformer TR2.

In this manner, in the first embodiment, the signal can be transmitted from the drive circuit DR to the control circuit CC by using inductive coupling via the electrically insulated transformer TR2, and thus, the signal can be transmitted while suppressing the transmission of electrical noise from the drive circuit DR to the control circuit CC. Hence, according to the first embodiment, malfunction of the control circuit CC caused by electrical noise superimposed on the signal can be suppressed, and therefore, operation reliability of the semiconductor device can be improved.

The transformer TR1 is constituted by the coil CL1$a$ and the coil CL1$b$ formed within the semiconductor chip CHP1, and the coil CL1$a$ and the coil CL1$b$ are not connected by a conductor but are magnetically coupled to each other. Thus, when a current flows through the coil CL1$a$, an induced electromotive force is generated in the coil CL1$b$ in response to a change in this current, so that an induced current is flowed. At this time, the coil CL1$a$ is a primary coil and the coil CL1$b$ is a secondary coil. In this manner, the first embodiment uses an electromagnetic induction phenomenon that occurs between the coil CL1$a$ and the coil CL1b. In other words, in the first embodiment, the signal is transmitted from the transmission circuit TX1 to the coil CL1a of the transformer TR1 to flow a current, and the induced current generated in the coil CL1b of the transformer TR1 in response to the current is detected in the reception circuit RX1, whereby the reception circuit RX1 can receive the signal corresponding to the control signal outputted from the transmission circuit TX1.

Likewise, the transformer TR2 is constituted by the coil CL2a and the coil CL2b formed within the semiconductor chip CHP1, and the coil CL2a and the coil CL2b are not connected by a conductor but are magnetically coupled to each other. Thus, when a current flows through the coil CL2b, an induced electromotive force is generated in the coil CL2a in response to a change in this current, so that an induced current is flowed. In this manner, in the first embodiment, the signal is transmitted from the transmission circuit TX2 to the coil CL2b of the transformer TR2 to flow a current, and the induced current generated in the coil CL2a of the transformer TR2 in response to the current is detected in the reception circuit RX2, whereby the reception circuit RX2 can receive the signal corresponding to the control signal outputted from the transmission circuit TX2.

The signals are transmitted and received between the semiconductor chip CHP1 and the semiconductor chip CHP2 through a path that extends from the transmission circuit TX1 to the reception circuit RX1 via the transformer TR1 and a path that extends from the transmission circuit TX2 to the reception circuit RX2 via the transformer TR2. In other words, the reception circuit RX1 receives the signal transmitted from the transmission circuit TX1, and the reception circuit RX2 receives the signal transmitted from the transmission circuit TX2, whereby signal transmission and reception can be performed between the semiconductor chip CHP1 and the semiconductor chip CHP2. As described above, the transformer TR1 is involved in transmitting the signal from the transmission circuit TX1 to the reception circuit RX1, whereas the transformer TR2 is involved in transmitting the signal from the transmission circuit TX2 to the reception circuit RX2. Hence, the drive circuit DR can drive the inverter INV that actuates the load LOD in response to the signal transmitted from the semiconductor chip CHP1 to the semiconductor chip CHP2.

The semiconductor chip CHP1 and the semiconductor chip CHP2 have reference potentials that differ in voltage level. In other words, the reference potential in the semiconductor chip CHP1 is fixed at the ground potential GND1. On the other hand, as shown in FIG. 1, the semiconductor chip CHP2 is electrically connected with the inverter INV, and the drive circuit DR for driving the inverter INV is formed within the semiconductor chip CHP2. The inverter INV includes, for example, a high-side IGBT (Insulated Gate Bipolar Transistor) and a low-side IGBT. Further, ON/OFF control of the high-side IGBT and ON/OFF control of the low-side IGBT in the inverter INV are performed by the drive circuit DR formed within the semiconductor chip CHP2, and thus, control of the load LOD can be achieved by the inverter INV. Specifically, the ON/OFF control of the high-side IGBT is performed by the drive circuit DR formed within the semiconductor chip CHP2 controlling a potential applied to a gate electrode of the high-side IGBT. Likewise, the ON/OFF control of the low-side IGBT is performed by the drive circuit DR formed within the semiconductor chip CHP2 controlling a potential applied to a gate electrode of the low-side IGBT.

Here, for example, the ON control of the low-side IGBT is achieved by applying "an emitter potential (0 V)+a threshold voltage (15 V)" to the gate electrode of the low-side IGBT based on the emitter potential (0 V) of the low-side IGBT serving as the reference potential connected with the ground potential GND2. On the other hand, for example, the OFF control of the low-side IGBT is achieved by applying "the emitter potential (0 V)" to the gate electrode of the low-side IGBT based on the emitter potential (0 V) of the low-side IGBT serving as the reference potential connected with the ground potential GND2. Therefore, the ON/OFF control of the low-side IGBT is performed by whether or not the threshold voltage (15 V) is applied to the gate electrode based on 0 V serving as the reference potential.

On the other hand, for example, the ON control of the high-side IGBT is also performed by whether or not "a reference potential+a threshold voltage (15 V)" is applied to the gate electrode of the high-side IGBT based on an emitter potential of the high-side IGBT serving as the reference potential. However, unlike the emitter potential of the low-side IGBT, the emitter potential of the high-side IGBT is not fixed at the ground potential GND2. In other words, in the inverter INV, the high-side IGBT and the low-side IGBT are connected in series between the power-supply potential VCC2 and the ground potential GND2. Further, control to turn OFF the low-side IGBT when the high-side IGBT is ON and control to turn ON the low-side IGBT when the high-side IGBT is OFF are performed in the inverter INV. Therefore, since the low-side IGBT is ON when the high-side IGBT is OFF, the low-side IGBT that is ON causes the emitter potential of the high-side IGBT to become the ground potential GND2. On the other hand, since the low-side IGBT is OFF when the high-side IGBT is ON, the emitter potential of the high-side IGBT becomes the power-supply potential VCC2. At this time, the ON/OFF control of the high-side IGBT is performed by whether or not "the reference potential+the threshold voltage (15 V)" is applied to the gate electrode based on the emitter potential of the high-side IGBT serving as the reference potential.

As described above, the emitter potential of the high-side IGBT varies depending on whether the high-side IGBT is ON or OFF. In other words, the emitter potential of the high-side IGBT varies between the ground potential GND2 (0 V) and the power-supply potential VCC2 (for example, 600 V). Therefore, in order to turn ON the high-side IGBT, it is necessary to apply "the reference potential (600 V)+the threshold voltage (15 V)" to the gate electrode based on the emitter potential of the high-side IGBT serving as the reference potential. Thus, it is necessary for the drive circuit DR performing the ON/OFF control of the high-side IGBT to recognize the emitter potential of the high-side IGBT. For this purpose, the drive circuit DR is configured to receive an input of the emitter potential of the high-side IGBT. As a result, the reference potential of 600 V is inputted to the drive circuit DR formed within the semiconductor chip CHP2, and the drive circuit DR controls to turn ON the high-side IGBT by applying the threshold voltage of 15 V to the gate electrode of the high-side IGBT based on the reference potential of 600 V. Therefore, a high potential of approximately 600 V is applied to the semiconductor chip CHP2. In this manner, a circuit handling a low potential (several tens of volts) is formed within the semiconductor chip CHP1 of the first embodiment, whereas a circuit handling the high potential (several hundreds of volts) is formed within the semiconductor chip CHP2 of the first embodiment. Thus, signal transmission between the semiconductor chip CHP1 and the semiconductor chip CHP2 needs to be performed between circuits having different potentials.

In this regard, in the first embodiment, since signal transmission between the semiconductor chip CHP1 and the semiconductor chip CHP2 is performed via the transformer TR1 and the transformer TR2, the signals can be transmitted between circuits having different potentials.

As described above, in the transformer TR1 and the transformer TR2, a large potential difference may be generated between each primary coil and the corresponding secondary coil. Conversely, since the large potential difference may be generated, each primary coil and the corresponding secondary coil that are not connected by a conductor but are magnetically coupled to each other are used for signal transmission. Therefore, from the viewpoint of improving the operation reliability of the semiconductor device, it is important to set a withstand voltage between the coil CL1a and the coil CL1b as high as possible when forming the transformer TR1. Likewise, from the viewpoint of improving the operation reliability of the semiconductor device, it is important to set a withstand voltage between the coil CL2b and the coil CL2a as high as possible when forming the transformer TR2.

<Example of Signal Transmission>

Figure 2:
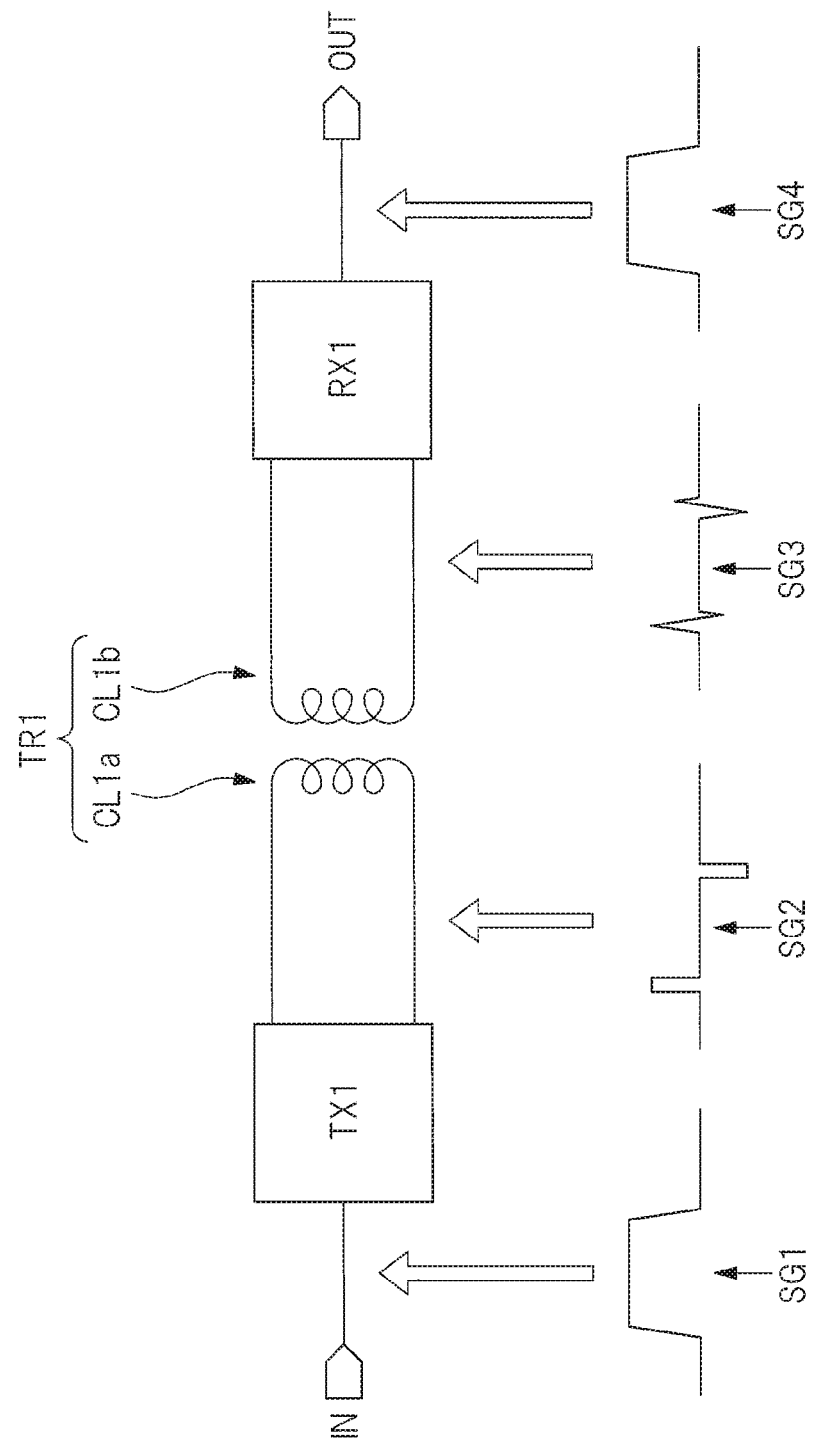
FIG. 2 is an explanatory diagram showing an example of signal transmission.

FIG. 2 is an explanatory diagram showing an example of signal transmission. In FIG. 2, the transmission circuit TX1 generates a signal SG2 having a fixed pulse width by extracting a rising edge portion of a square wave signal SG1 inputted to the transmission circuit TX1 and transmits the signal SG2 to the coil CL1a (primary coil) of the transformer TR1. When a current according to this signal SG2 flows through the coil CL1a (primary coil) of the transformer TR1, a signal SG3 corresponding to this current is flowed to the coil CL1b (secondary coil) of the transformer TR1 by the induced electromotive force. By amplifying this signal SG3 via the reception circuit RX1 and further modulating the signal SG3 into a square wave, a square wave signal SG4 is outputted from the reception circuit RX1. Hence, the signal SG4 corresponding to the signal SG1 inputted to the transmission circuit TX1 can be outputted from the reception circuit RX1. In this manner, the signal can be transmitted from the transmission circuit TX1 to the reception circuit RX1. The signal can be transmitted from the transmission circuit TX2 to the reception circuit RX2 in the same manner.

DESCRIPTION OF RELATED ART

Next, a related art regarding a device structure of a transformer will be described.

Figure 3:
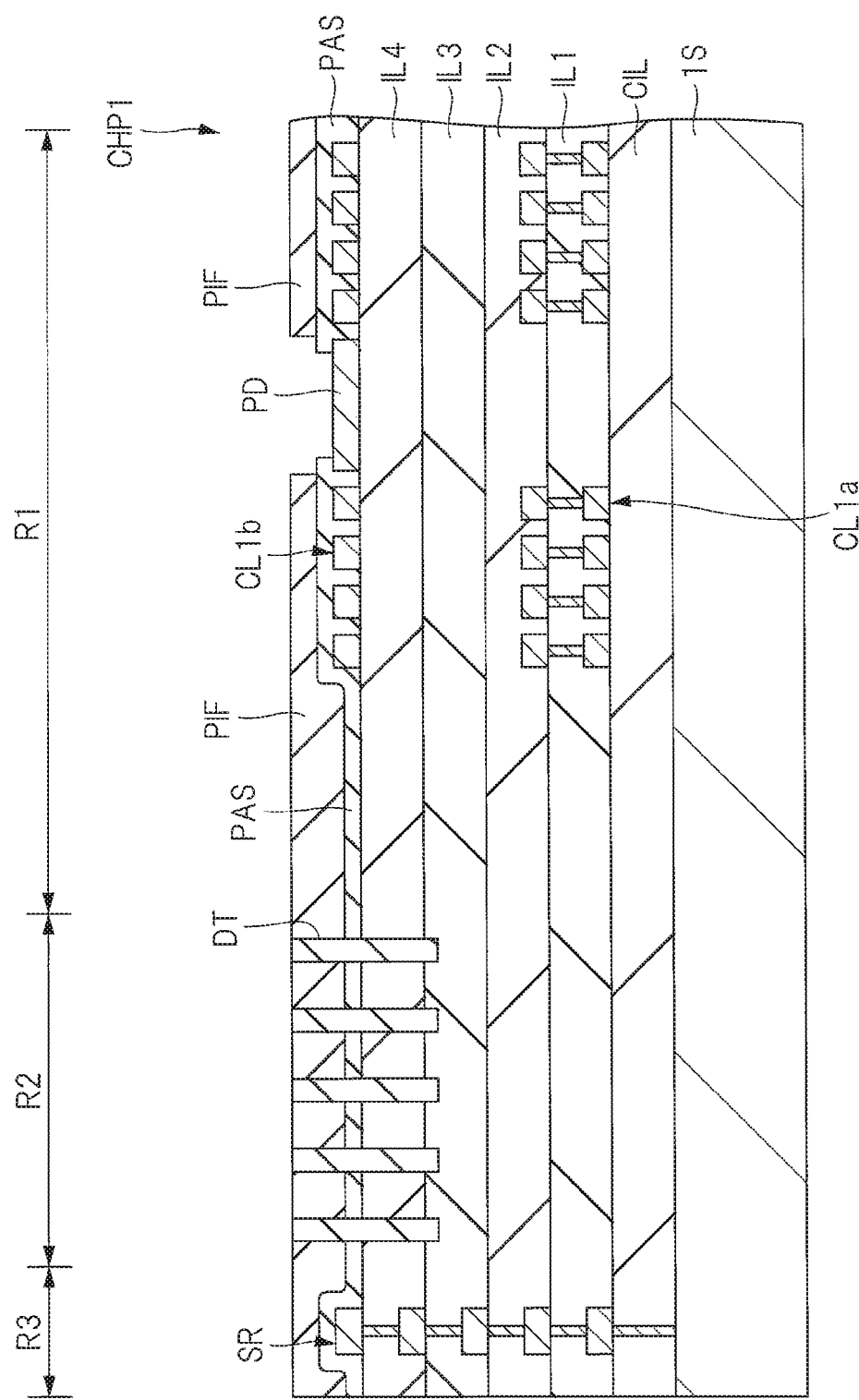
FIG. 3 is a cross-sectional view showing a schematic structure of a semiconductor chip having a transformer formed therein according to a related art.

FIG. 3 is a cross-sectional view showing a schematic structure of a semiconductor chip CHP1 having a transformer formed therein according to the related art. In FIG. 3, the semiconductor chip CHP1 of the related art includes a semiconductor substrate 1S, and a transistor (not shown) is formed on this semiconductor substrate 1S. Further, a contact interlayer insulating film CIL is formed over the semiconductor substrate 1S on which the transistor is formed, and an interlayer insulating film IL1 is formed over this contact interlayer insulating film CIL. Additionally, an interlayer insulating film IL2 is formed over the interlayer insulating film IL1, and an interlayer insulating film IL3 is formed over this interlayer insulating film IL2. Moreover, an interlayer insulating film IL4 is formed over the interlayer insulating film IL3, and a surface protective film (passivation film) PAS is formed over this interlayer insulating film IL4. Furthermore, a polyimide resin film PIF is formed over the surface protective film PAS.

In addition, FIG. 3 shows a region R1, a region R2, and a region R3 within the semiconductor chip CHP1. A coil CL1a and a coil CL1b constituting the transformer are formed within the region R1. Specifically, as shown in FIG. 3, the coil CL1a is formed to have a structure in which a wiring pattern formed on the contact interlayer insulating film CIL within the region R1 and a wiring pattern formed on the interlayer insulating film IL1 within the region R1 are connected to each other via a plug. On the other hand, as shown in FIG. 3, the coil CL1b constituted by a wiring pattern formed on the interlayer insulating film IL4 within the region R1 is formed above the coil CL1a, and a pad PD is formed in the same layer as this coil CL1b.

Subsequently, as shown in FIG. 3, a plurality of trenches DT that penetrate the polyimide resin film PIF, the surface protective film PAS, and the interlayer insulating film IL4 so as to extend from a surface of the polyimide resin film PIF to the interlayer insulating film IL3 are formed within the region R2. Further, these trenches DT are filled with insulating material.

Then, as shown in FIG. 3, a seal ring SR that functions as a protective wall to suppress moisture from entering the semiconductor chip CHP1 is formed within the region R3.

In the semiconductor chip CHP1 of the related art configured as described above, the following advantages can be achieved. Namely, signal transmission between circuits having different potentials, that is, between the semiconductor chip CHP1 and the semiconductor chip CHP2, is performed via the transformer TR1 as described above with reference to FIG. 1. At this time, the coil CL1a (primary coil) and the coil CL1b (secondary coil) constituting the transformer TR1 are formed within the semiconductor chip CHP1 handling the low potential. However, the coil CL1b (secondary coil) formed within the semiconductor chip CHP1 is electrically connected with the pad PD, meaning that the coil CL1b is electrically connected with the drive circuit DR formed within the semiconductor chip CHP2 via this pad PD. Further, since the high potential is applied to the drive circuit DR formed within the semiconductor chip CHP2, the high potential is further applied to the coil CL1b electrically connected with this drive circuit DR. Therefore, in the semiconductor chip CHP1 shown in FIG. 3, the large potential difference is generated between the coil CL1b to which the high potential is applied and the seal ring SR which is electrically connected with the ground potential (0 V).

Here, since the low potential is applied to the coil CL1a and the high potential is applied to the coil CL1b, there may be concerns over problems regarding the withstand voltage between the coil CL1a and the coil CL1b. However, studies by the present inventors have found that prior to the withstand voltage between the coil CL1a and the coil CL1b becoming apparent as a problem, dielectric breakdown between the coil CL1b to which the high potential is applied and the seal ring SR which is electrically connected with the semiconductor substrate 1S and to which a ground potential GND1 is supplied becomes apparent as a problem in, for example, FIG. 3. In other words, according to the theory of the present inventors, leakage current is likely to flow along an interface between the interlayer insulating film IL4 and the surface protective film PAS in, for example, FIG. 3. As a result, prior to the withstand voltage between the coil CL1a and the coil CL1b becoming apparent as a problem, dielectric breakdown would occur between the coil CL1b to which the high potential is applied and the seal ring SR to which the ground potential GND1 is supplied.

Therefore, in the related art, as shown in FIG. 3, a plurality of trenches DT are formed within the region R2 sandwiched between the region R1 in which the coil CL1a and the coil CL1b are formed and the region R3 in which the seal ring SR is formed, and these trenches DT are filled with insulating material. Hence, as shown in FIG. 3, unevennesses are formed at the interface between the interlayer insulating film IL4 and the surface protective film PAS. This means that a distance between the coil CL1b and the seal ring SR along the interface between the interlayer insulating film IL4 and the surface protective film PAS is increased. As a result, the distance between the coil CL1b and the seal ring SR along the interface between the interlayer insulating film IL4 and the surface protective film PAS can be increased without increasing the size of the semiconductor chip CHP1. Therefore, the distance between the coil CL1b to which the high potential is applied and the seal ring SR to which the ground potential GND1 is applied is elongated, and thus, according to the related art, dielectric breakdown between the coil CL1b and the seal ring SR can be suppressed.

<Studies on Improving Related Art>

However, studies on the related art by the present inventors have found that there is room for further improvement regarding the related art, and these improvements will be described below.

As shown in FIG. 3, in the related art, the trenches DT filled with insulating material are formed within the region R2 sandwiched between the region R1 in which the coil CL1b is formed and the region R3 in which the seal ring SR is formed. Hence, according to the related art, the distance between the coil CL1b and the seal ring SR along the interface between the interlayer insulating film IL4 and the surface protective film PAS can be increased. As a result, according to the related art, it is advantageous in that dielectric breakdown between the coil CL1b and the seal ring SR can be suppressed.

However, in the manufacturing method of the semiconductor device of the related art, it is necessary to add a step of forming the trenches DT and a step of filling the trenches DT with insulating material. In particular, the step of forming the trenches DT requires a step of performing a photolithography process and an etching process using a mask, and the step of filling the trenches DT with insulating material requires a step of depositing the insulating material and a step of removing the insulating material from the surface of the polyimide resin film PIF.

In this manner, although the related art is advantageous in that dielectric breakdown between the coil CL1b and the seal ring SR is suppressed by forming the trenches DT filled with insulating material, additional manufacturing steps are necessary as described above, with the result that the manufacturing process is complicated. Further, since the manufacturing process being complicated implies that the number of additional manufacturing steps increases by that much, this would likely cause a decrease in manufacturing yield. Additionally, since the mask for forming the trenches DT needs to be produced along with the additional manufacturing steps, this would cause an increase in manufacturing cost.

In other words, in the related art, although dielectric breakdown between the coil CL1b and the seal ring SR can be suppressed, there is room for improvement from the viewpoint of suppressing a decrease in manufacturing yield and an increase in manufacturing cost caused by the complicated manufacturing process. Therefore, improvements are incorporated into the first embodiment in order to suppress dielectric breakdown between the coil CL1b and the seal ring SR, while also suppressing a decrease in manufacturing yield and an increase in manufacturing cost. Technical ideas of the improvements incorporated into the first embodiment will be described below.

<Configuration of Semiconductor Chip>

Figure 4:
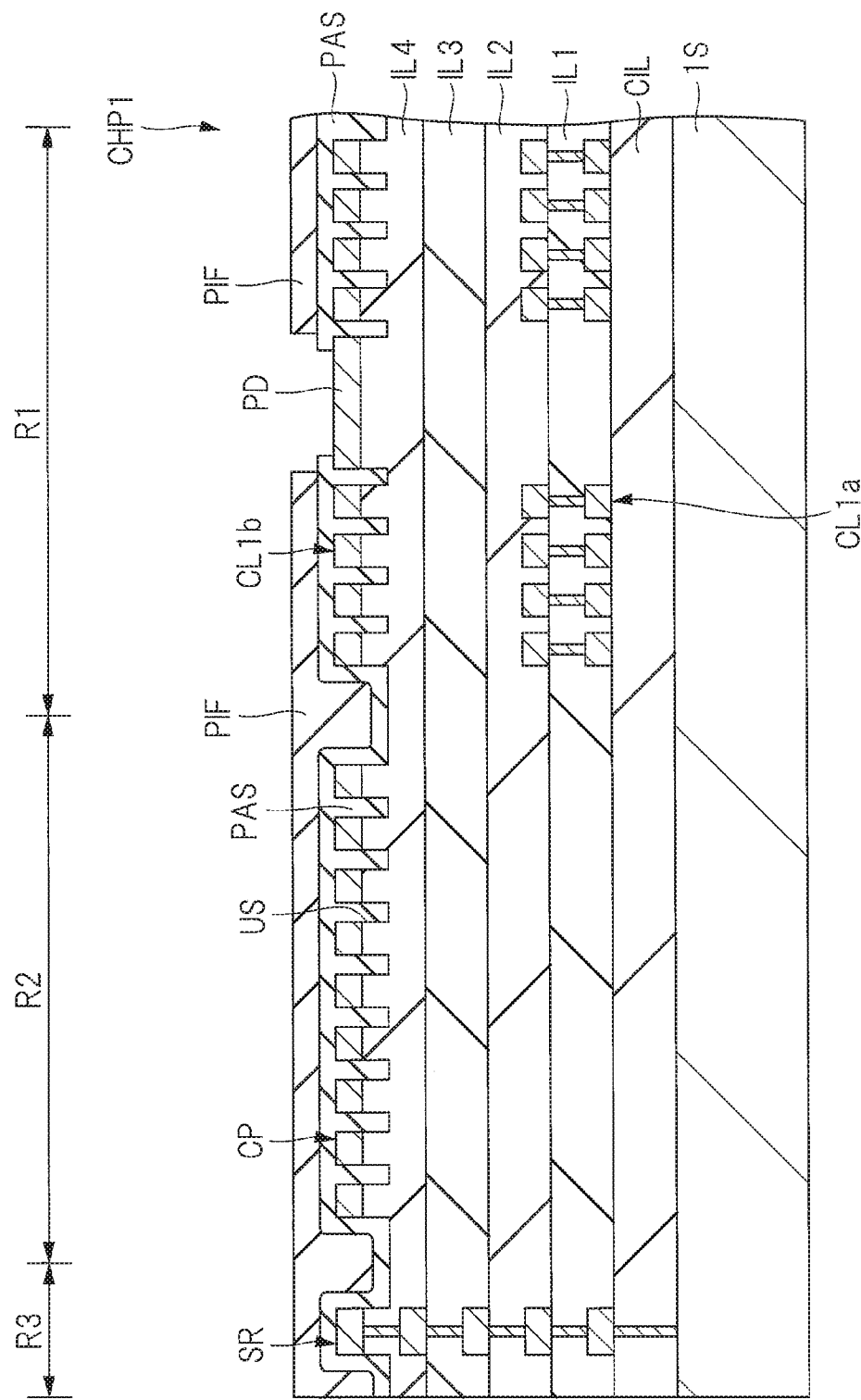
FIG. 4 is a cross-sectional view showing a schematic device structure of a semiconductor chip according to a first embodiment of the present invention.

FIG. 4 is a cross-sectional view showing a schematic device structure of the semiconductor chip CHP1 of the first embodiment. In FIG. 4, the semiconductor chip CHP1 of the first embodiment includes a semiconductor substrate 1S, and a transistor (such as a field-effect transistor (not shown)) is formed on this semiconductor substrate 1S. Further, a contact interlayer insulating film CIL made of, for example, a silicon oxide film is formed over the semiconductor substrate 1S on which the transistor is formed, and an interlayer insulating film IL1 made of, for example, a silicon oxide film is formed over this contact interlayer insulating film CIL. Additionally, an interlayer insulating film IL2 made of, for example, a silicon oxide film is formed over the interlayer insulating film IL1, and an interlayer insulating film IL3 made of, for example, a silicon oxide film is formed over this interlayer insulating film IL2. Furthermore, an interlayer insulating film IL4 made of, for example, a silicon oxide film is formed over the interlayer insulating film IL3, and a surface protective film (passivation film) PAS made of, for example, a silicon nitride film is formed over this interlayer insulating film IL4. A polyimide resin film PIF is formed over the surface protective film PAS.

Next, FIG. 4 shows a region R1, a region R2, and a region R3 within the semiconductor chip CHP1. The coil CL1a and the coil CL1b constituting the transformer are formed within the region R1. Specifically, as shown in FIG. 4, the coil CL1a is formed to have a structure in which a wiring pattern formed on the contact interlayer insulating film CIL within the region R1 and a wiring pattern formed on the interlayer insulating film IL1 within the region R1 are connected to each other via a plug. On the other hand, as shown in FIG. 4, the coil CL1b constituted by a wiring pattern formed on the interlayer insulating film IL4 within the region R1 is formed above the coil CL1a, and a pad PD is formed in the same layer as this coil CL1b. In this manner, the coil CL1a and the coil CL1b are formed within the region R1 of the semiconductor chip CHP1, and the transformer is constituted by the coil CL1a and the coil CL1b. In other words, the transformer that allows signal transmission between different potentials by using inductive coupling is formed within the region R1 of the semiconductor chip CHP1.

Next, as shown in FIG. 4, unevennesses US are formed within a boundary region between the interlayer insulating film IL4 and the surface protective film PAS within the region R2 of the semiconductor chip CHP1. The unevennesses are constituted by convex portions and concave portions that are adjacent to each other. Further, as shown in FIG. 4, a conductive pattern CP is formed on each of the convex portions partially constituting the unevennesses. This conductive pattern CP is formed in the same layer as the coil CL1b formed within the region R1 of the semiconductor chip CHP1. Additionally, a potential of the conductive pattern CP is a floating potential.

Next, as shown in FIG. 4, a seal ring SR that functions as a protective wall to suppress moisture from entering the semiconductor chip CHP1 is formed within the region R3 of the semiconductor chip CHP1. In this manner, the coil CL1a (inductor) and the coil CL1b (inductor) constituting the transformer are formed within the region R1 of the semiconductor chip CHP1, and the conductive pattern arranged in the same layer as the coil CL1b is formed within the region R2 of the semiconductor chip CHP1. In other words, as shown in FIG. 4, the region R2 is sandwiched between an end portion of the semiconductor chip CHP1 and the region R1 in cross-sectional view, and the conductive pattern CP is formed within this region R2. The conductive pattern CP formed within the region R2 is formed on each of the convex portions partially constituting the unevennesses US. More specifically, the semiconductor chip CHP1 includes: the region R1 in which the coil CL1a and the coil CL1b constituting the transformer are formed; the region R2 in which the conductive pattern CP is formed; and the region R3 in which the seal ring SR is formed. Further, as shown in FIG. 4, the region R2 is sandwiched between the region R1 and the region R3 in cross-sectional view, the unevennesses US are formed between the interlayer insulating film IL4 and the surface protective film PAS within this region R2, and the conductive pattern CP is formed on each of the convex portions partially constituting the unevennesses.

As described above, the semiconductor device of the first embodiment includes the semiconductor chip CHP1 in which components that allow signal transmission between different potentials by using inductive coupling are formed. Further, as shown in FIG. 4, the semiconductor chip CHP1 comprises: the interlayer insulating film IL4 formed above the semiconductor substrate 1S; a wiring layer that is an uppermost wiring layer formed over the interlayer insulating film IL4; the interlayer insulating film (surface protective film PAS) formed over the interlayer insulating film IL4 so as to cover the wiring layer; the coil CL1b (inductor) formed in the wiring layer; and the conductive pattern CP formed in the wiring layer. Additionally, as shown in FIG. 4, the semiconductor chip CHP1 of the first embodiment includes a lower wiring layer located below the uppermost wiring layer, and the coil CL1a that can be inductively coupled to the coil CL1b is formed in the lower wiring layer.

At this time, as shown in FIG. 4, the unevennesses US are formed between the interlayer insulating film IL4 and the surface protective film PAS (interlayer insulating film). The unevennesses include the convex portions and the concave portions that are adjacent to one another, and the conductive pattern CP is arranged on each of the convex portions. Here, the interlayer insulating film IL4 and the surface protective film PAS (interlayer insulating film) are made of different types of films. Specifically, the interlayer insulating film IL4 is made of a silicon oxide film, whereas the surface protective film PAS is made of a silicon nitride film.

Figure 5:
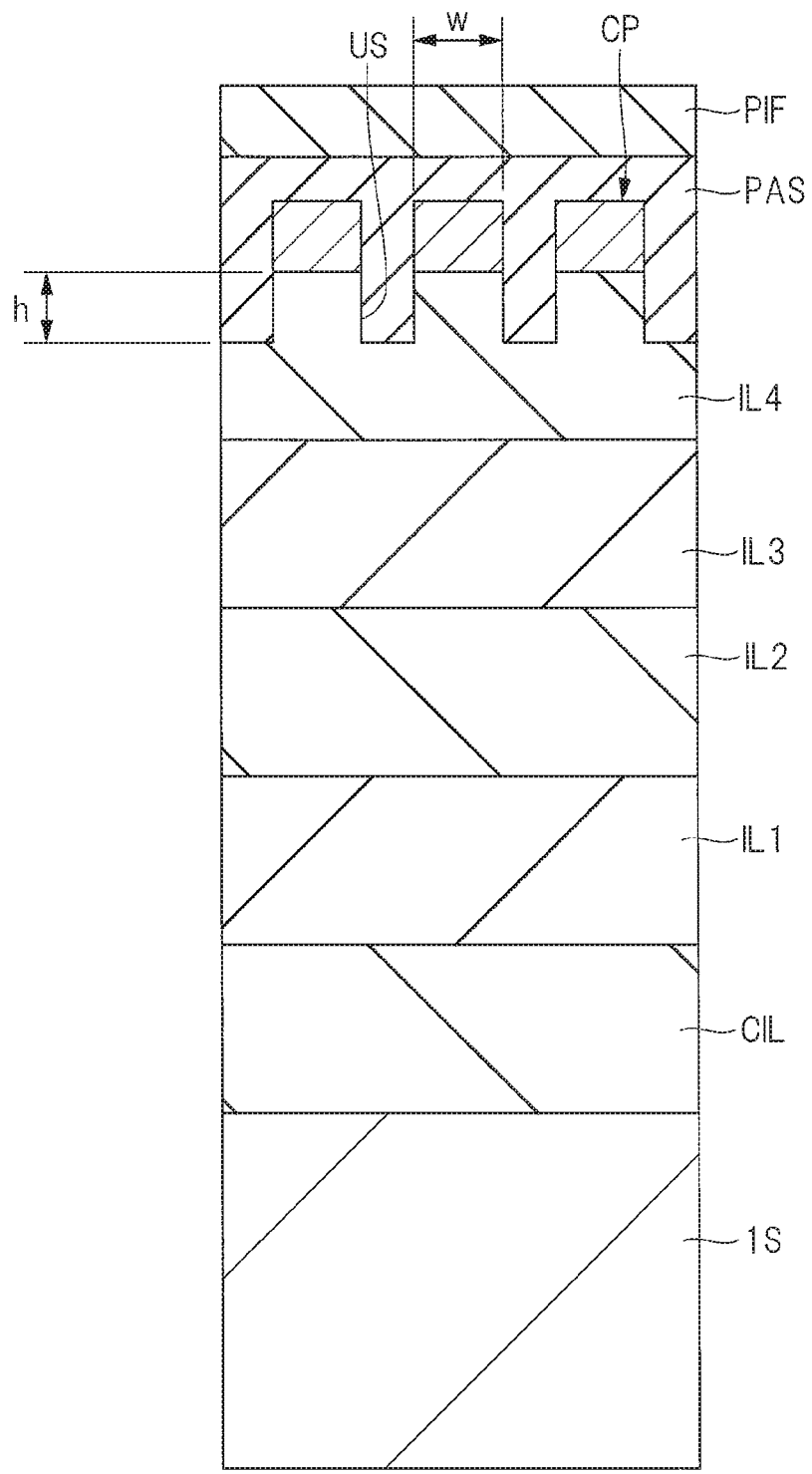
FIG. 5 is an enlarged view partially showing one region within the semiconductor chip shown in FIG. 4.

Next, FIG. 5 is an enlarged view partially showing the region R2 within the semiconductor chip CHP1 shown in FIG. 4. In FIG. 5, the unevennesses US constituted by the convex portions and the concave portions that are adjacent to one another are formed between the interlayer insulating film IL4 and the surface protective film PAS, and the conductive pattern CP is formed on each of the convex portions partially constituting the unevennesses US. At this time, when "w" denotes a width of an upper surface of the convex portion partially constituting the unevennesses US and "h" denotes a height from a bottom surface of the concave portion partially constituting the unevennesses US to the upper surface of the convex portion as shown in FIG. 5, a relation of w<2×h is satisfied.

<Manufacturing Method of Semiconductor Device>

The semiconductor device that includes the semiconductor chip CHP1 according to the first embodiment is configured as described above, and the manufacturing method thereof will be described below with reference to the drawings.

Figure 6:
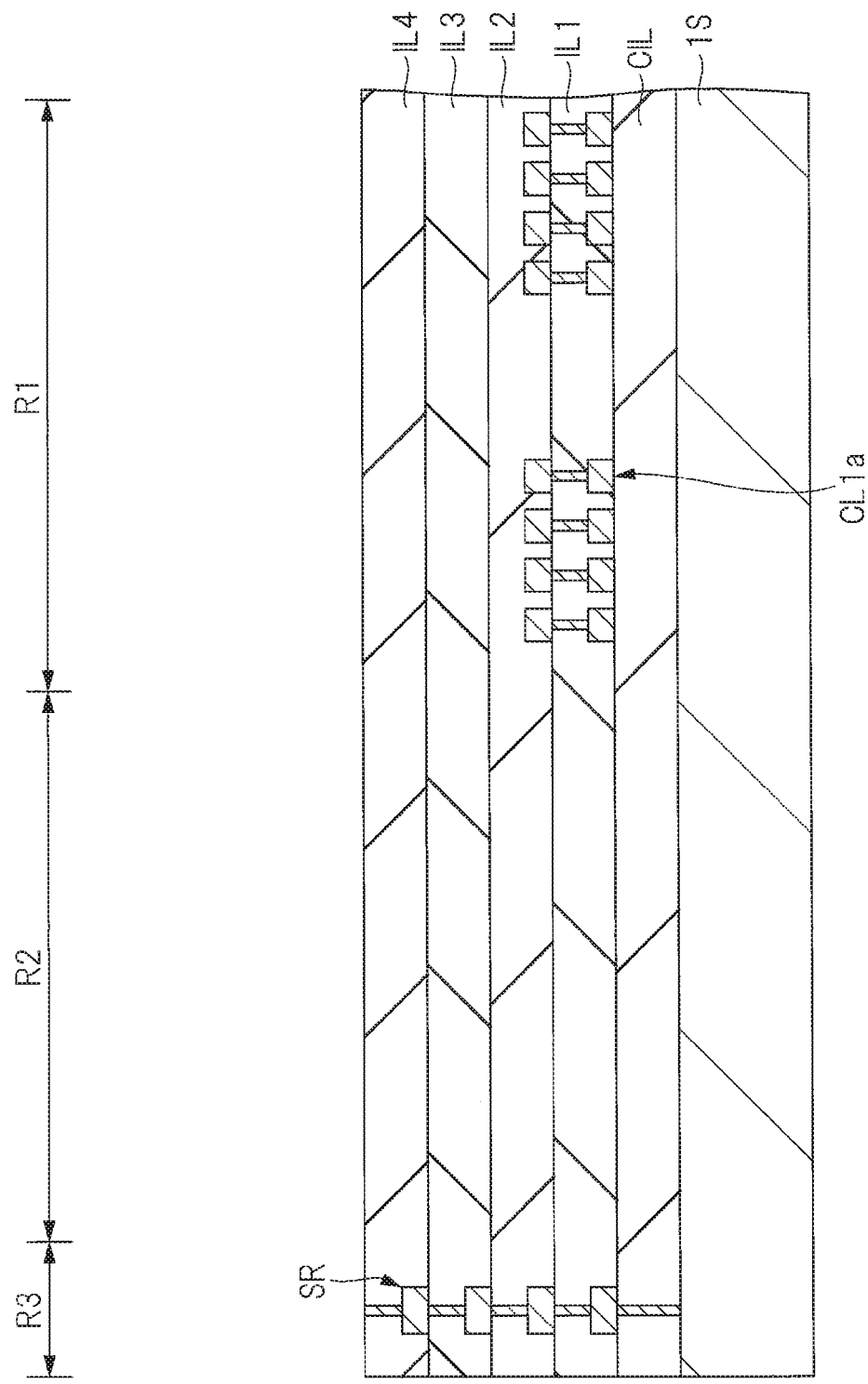
FIG. 6 is a cross-sectional view showing a manufacturing process of the semiconductor device according to the first embodiment.

First, a structure shown in FIG. 6 is formed by using a semiconductor manufacturing technique. Specifically, in the structure shown in FIG. 6, the contact interlayer insulating film CIL made of, for example, a silicon oxide film is formed over the semiconductor substrate 1S made of, for example, silicon, and the interlayer insulating film IL1 made of, for example, a silicon oxide film is formed over this contact interlayer insulating film CIL. Further, the interlayer insulating film IL2 made of, for example, a silicon oxide film is formed over the interlayer insulating film IL1, the interlayer insulating film IL3 made of, for example, a silicon oxide film is formed over this interlayer insulating film IL2, and the interlayer insulating film IL4 made of, for example, a silicon oxide film is formed over this interlayer insulating film IL3. Additionally, the coil CL1a is formed within the region R1, and the seal ring SR is formed within the region R3.

Figure 7:
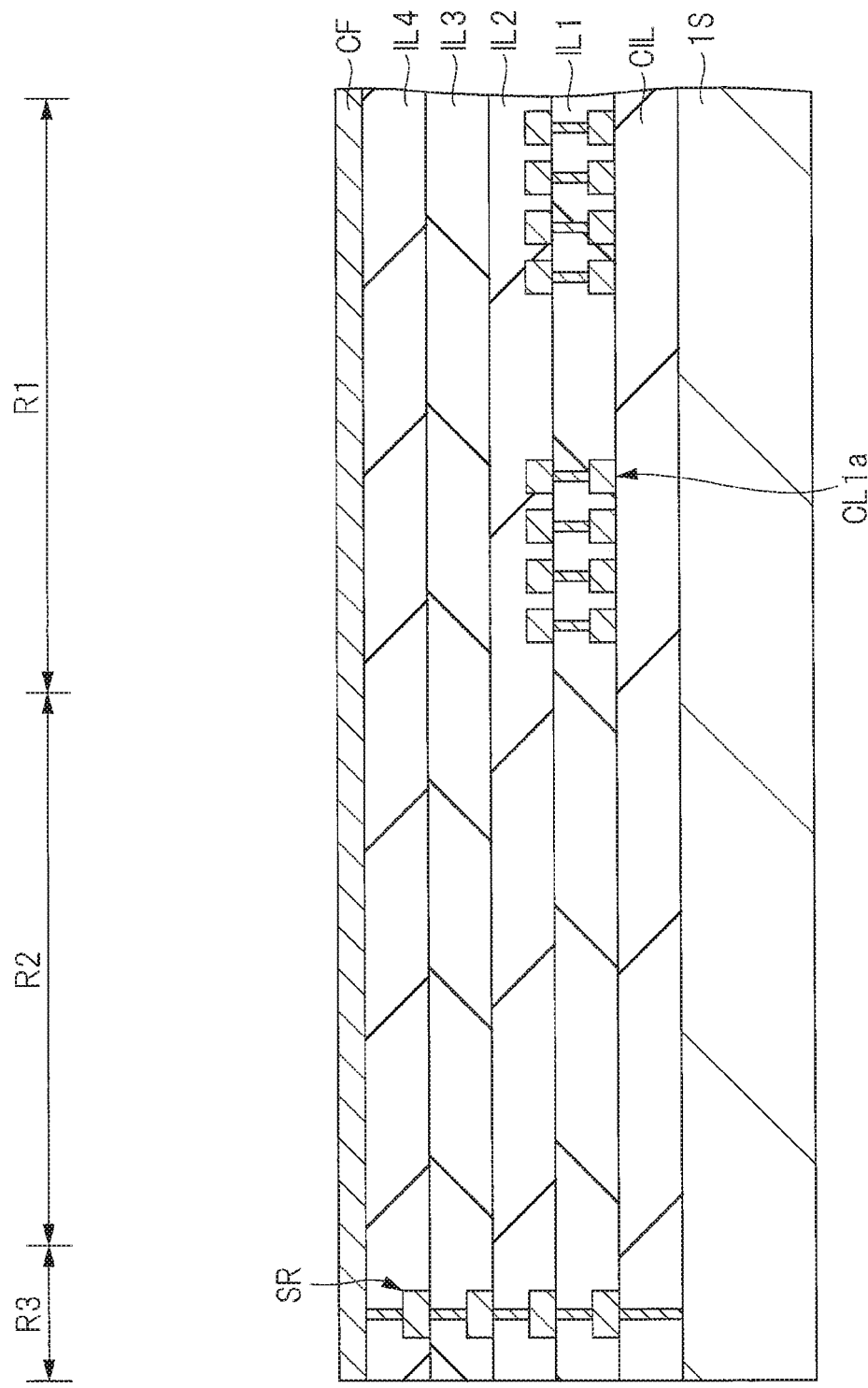
FIG. 7 is a cross-sectional view showing the manufacturing process of the semiconductor device continued from FIG. 6.

After the structure shown in FIG. 6 as described above is formed, a conductive film CF is formed over the interlayer insulating film IL4 as shown in FIG. 7. The conductive film CF is made of, for example, an aluminum film or an aluminum alloy film and can be formed by using, for example, a sputtering process.

Figure 8:
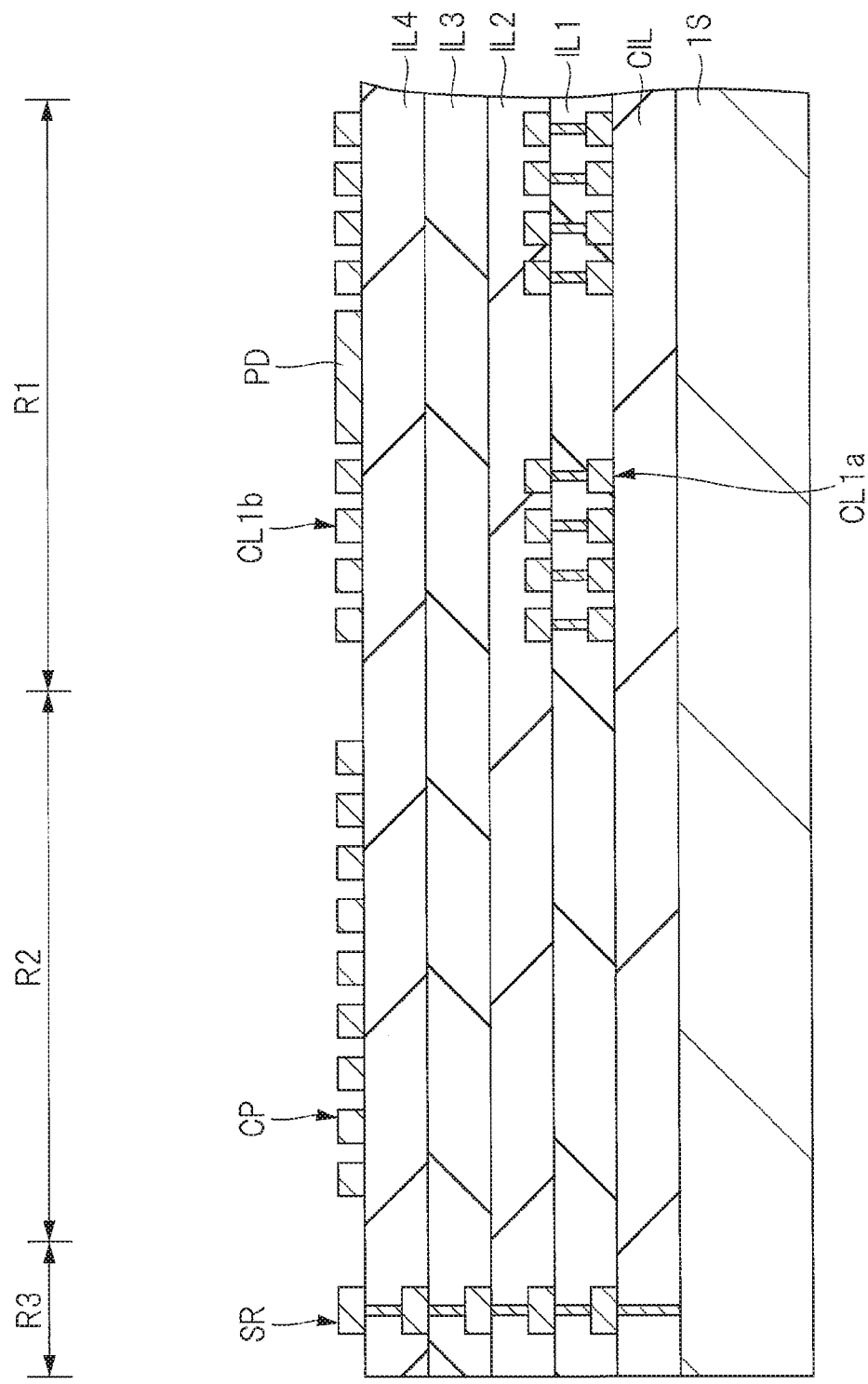
FIG. 8 is a cross-sectional view showing the manufacturing process of the semiconductor device continued from FIG. 7.

Next, as shown in FIG. 8, the conductive film CF is patterned by using a photolithography technique and an etching technique. The conductive film CF is patterned such that the coil CL1b (inductor) and the pad PD are formed within the region R1, the conductive pattern CP is formed within the region R2, and an uppermost layer of the seal ring is formed within the region R3. Hence, the coil CL1b, the pad PD, the conductive pattern CP, and the uppermost layer of the seal ring can be formed in the same layer on the interlayer insulating film IL4.

Figure 9:
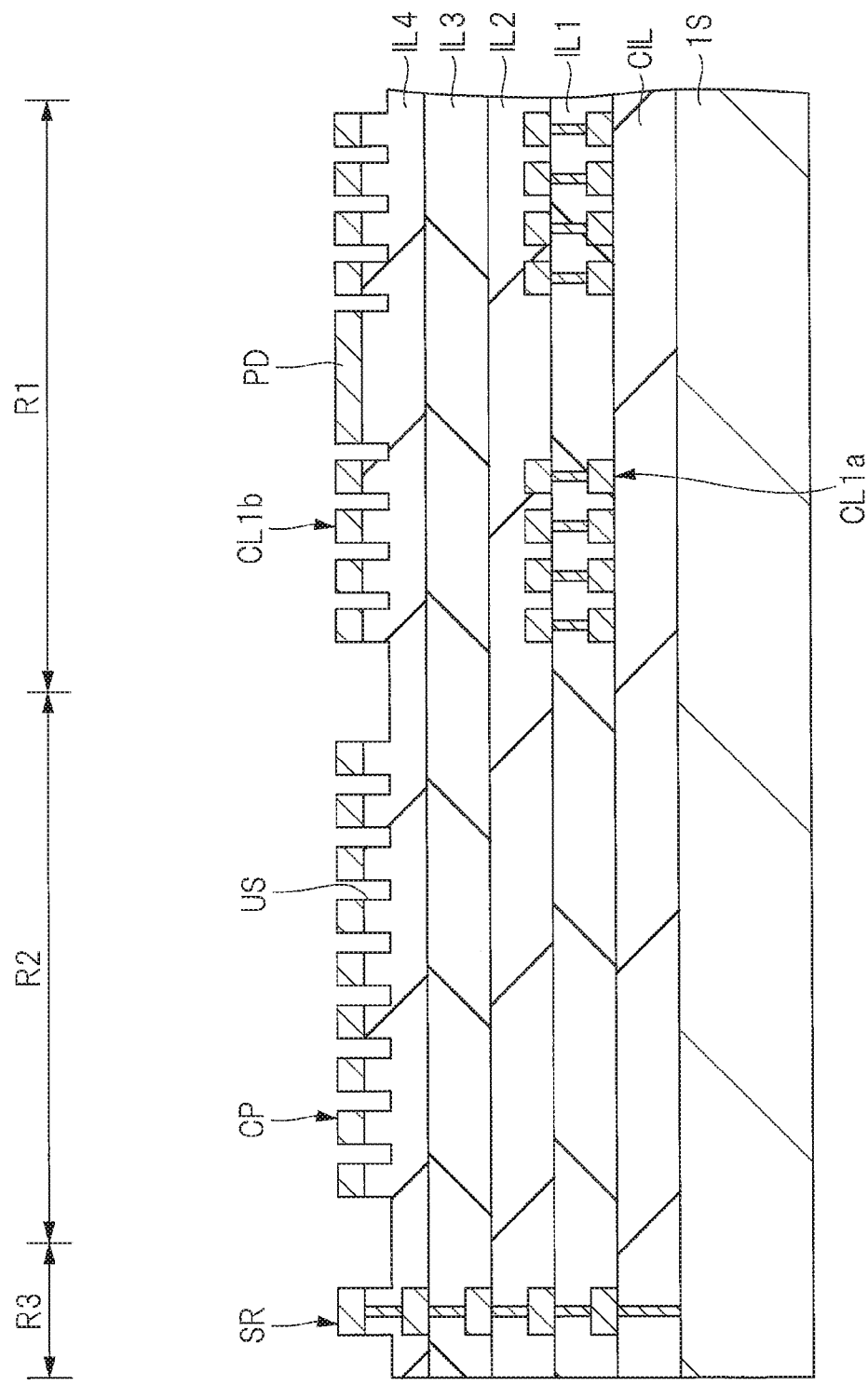
FIG. 9 is a cross-sectional view showing the manufacturing process of the semiconductor device continued from FIG. 8.

Subsequently, as shown in FIG. 9, a portion of the interlayer insulating film IL4 is etched with using the patterned conductive film CF as a hard mask, thereby forming the unevennesses US on a surface of the interlayer insulating film IL4. Specifically, as shown in FIG. 9, the portion of the interlayer insulating film IL4 is etched with using the coil CL1b, the pad PD, the conductive pattern CP, and the uppermost layer of the seal ring partially constituting the patterned conductive film CF as a hard mask. Hence, trenches are formed on the surface of the interlayer insulating film IL4 that is exposed through the coil CL1b and the pad PD within the region R1. Likewise, trenches are formed on the surface of the interlayer insulating film IL4 that is exposed through the conductive pattern CP within the region R2, and trenches are formed on the surface of the interlayer insulating film IL4 that is exposed through the uppermost layer of the seal ring SR within the region R3.

Figure 10:
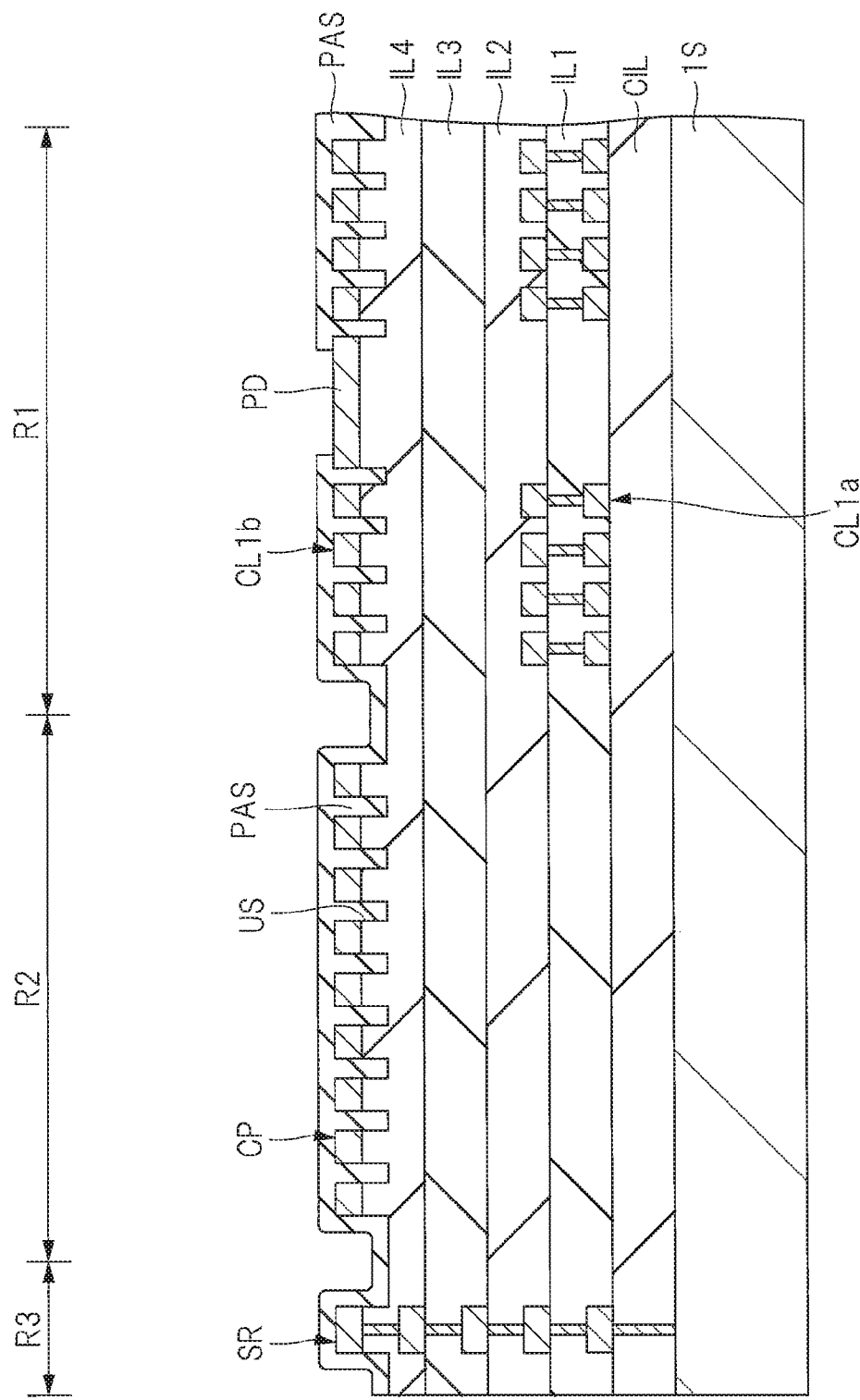
FIG. 10 is a cross-sectional view showing the manufacturing process of the semiconductor device continued from FIG. 9.

Thereafter, as shown in FIG. 10, the surface protective film PAS is formed so as to cover the coil CL1b, the pad PD, the conductive pattern CP, and the uppermost layer of the seal ring formed on the interlayer insulating film IL4 having the unevennesses. This surface protective film PAS is made of, for example, a silicon nitride film and can be formed by using, for example, a CVD (Chemical Vapor Deposition) process. Then, an opening that exposes a surface of the pad PD is formed in the surface protective film PAS by using the photolithography technique and the etching technique. Then, as shown in FIG. 4, the photosensitive polyimide resin film PIF is formed over the surface protective film PAS having the opening formed therein, and an opening is formed in the polyimide resin film PIF by using the photolithography technique. Hence, as shown in FIG. 4, the surface of the pad PD is exposed through the opening formed in the surface protective film PAS and the opening formed in the polyimide resin film PIF.

By using the conventional semiconductor manufacturing technique in subsequent steps, the semiconductor device that includes the semiconductor chip CHP1 of the first embodiment can be manufactured.

Features of First Embodiment

Next, features of the first embodiment will be described. A first feature of the first embodiment is that the unevennesses US are formed within the region R2 sandwiched between the region R1 of the semiconductor chip CHP1 in which the coil CL1a and the coil CL1b constituting the transformer are formed and the region R3 of the semiconductor chip CHP1 in which the seal ring SR is formed as shown in FIG. 4. Specifically, the first feature of the first embodiment is that the unevennesses US are formed between the interlayer insulating film IL4 and the surface protective film PAS. Hence, a creepage distance between the coil CL1b (secondary coil) to which the high potential is applied and the seal ring SR to which the reference potential (0 V) is applied along the interface between the interlayer insulating film IL4 and the surface protective film PAS can be increased as shown in FIG. 4. This means that leakage current flowing between the coil CL1b to which the high potential is applied and the seal ring SR to which the reference potential (0 V) is applied can be reduced according to the first feature of the first embodiment, and thus, the withstand voltage between the coil CL1b and the seal ring SR can be improved. As a result, according to the first feature of the first embodiment, reliability of the semiconductor device can be improved.

Next, a second feature of the first embodiment is that the conductive pattern CP is formed on each of the unevennesses US formed within the region R2 of the semiconductor chip CHP1 as shown in FIG. 4. Specifically, the second feature of the first embodiment is that the conductive pattern CP formed in the same layer as the coil CL1b within the region R1 is formed on each of the convex portions partially constituting the unevennesses US within the region R2. This is a result of incorporating the improvements into the manufacturing method of the semiconductor device of the first embodiment, whereby a configuration corresponding to the second feature can be incorporated into a final structure of the semiconductor chip CHP1. In other words, the essence of the second feature of the first embodiment resides in incorporating the improvements into the manufacturing method of the semiconductor device of the first embodiment.

Specifically, an improvement on the manufacturing method of the semiconductor device of the first embodiment is that the portion of the interlayer insulating film IL4 is etched with using the patterned conductive film, which includes the conductive pattern CP and the coil CL1b formed in the same layer, as the hard mask as shown in FIGS. 8 and 9. In this case, as shown in FIG. 8, the conductive film CF (see FIG. 7) formed over the interlayer insulating film IL4 is first patterned to simultaneously form the coil CL1b within the region R1 and the conductive pattern CP within the region R2. In this case, since the conductive pattern CP is formed on the interlayer insulating film IL4 within the region R2 during the step of forming the coil CL1b on the interlayer insulating film IL4 within the region R2, an additional step of forming the conductive pattern CP is unnecessary in the first embodiment (first advantage).

Further, in the manufacturing method of the semiconductor device of the first embodiment, as shown in FIG. 9, the unevennesses US are formed on the surface of the interlayer insulating film IL4 within the region R2 by etching the portion of the interlayer insulating film IL4 within the region R2 with using the above-described conductive pattern CP as the hard mask. In this case also, since the unevennesses US are formed by using the conductive pattern CP formed in the same layer as the coil CL1b, an additional mask for forming the unevennesses US is unnecessary in the first embodiment (second advantage).

Therefore, according to the improvements on the manufacturing method of the semiconductor device of the first embodiment, an additional manufacturing process for solely forming the unevennesses US is unnecessary. This means that, according to the manufacturing method of the semiconductor device of the first embodiment, the unevennesses US can be formed on the surface of the interlayer insulating film IL4 while suppressing the manufacturing process from becoming complicated. Thus, according to the first embodiment, dielectric breakdown between the coil CL1b and the seal ring SR can be suppressed by forming the unevennesses US while suppressing a decrease in manufacturing yield and an increase in manufacturing cost caused by the complicated manufacturing process. In other words, in the first embodiment, a significant effect in which dielectric breakdown between the coil CL1b and the seal ring SR is suppressed while suppressing a decrease in manufacturing yield and an increase in manufacturing cost can be achieved by combining the first feature and the second feature (the improvements on the manufacturing method).

Next, a third feature of the first embodiment is that when "w" denotes the width of the upper surface of the convex portion partially constituting the unevennesses US and "h" denotes the height from the bottom surface of the concave portion partially constituting the unevennesses US to the upper surface of the convex portion as shown in FIG. 5, the relation of $w<h\times 2$ is satisfied. Hence, according to the third feature of the first embodiment, the substantial creepage distance between the coil CL1b (secondary coil) to which the high potential is applied and the seal ring SR to which the reference potential (0 V) is applied along the interface between the interlayer insulating film IL4 and the surface protective film PAS can be increased. This is because since the conductive pattern CP is formed on each of the convex portions partially constituting the unevennesses US and the upper surface of each of the convex portions is thus in close contact with the conductive pattern CP as shown in FIG. 5 in the first embodiment, a distance corresponding to the width of the upper surface of each of the convex portions is considered to be a conductive path by the conductive pattern and is less likely to contribute to the increase in the substantial creepage distance. In other words, even if the unevennesses US are formed on the surface of the interlayer insulating film IL4, it would be difficult to increase the substantial creepage distance if $w>2\times h$ is satisfied. In this regard, according to the third feature of the first embodiment, since the substantial creepage distance can be infallibly increased by providing the unevennesses US, the withstand voltage between the coil CL1b and the seal ring SR can easily be improved. Thus, when the first feature and second feature of the first embodiment are combined, it is preferable to further adopt the third feature of the first embodiment from the viewpoint of easily securing the increase in the substantial creepage distance.

Modification

Next, a modification of the first embodiment will be described.

<<Configuration of Semiconductor Chip>>

Figure 11:
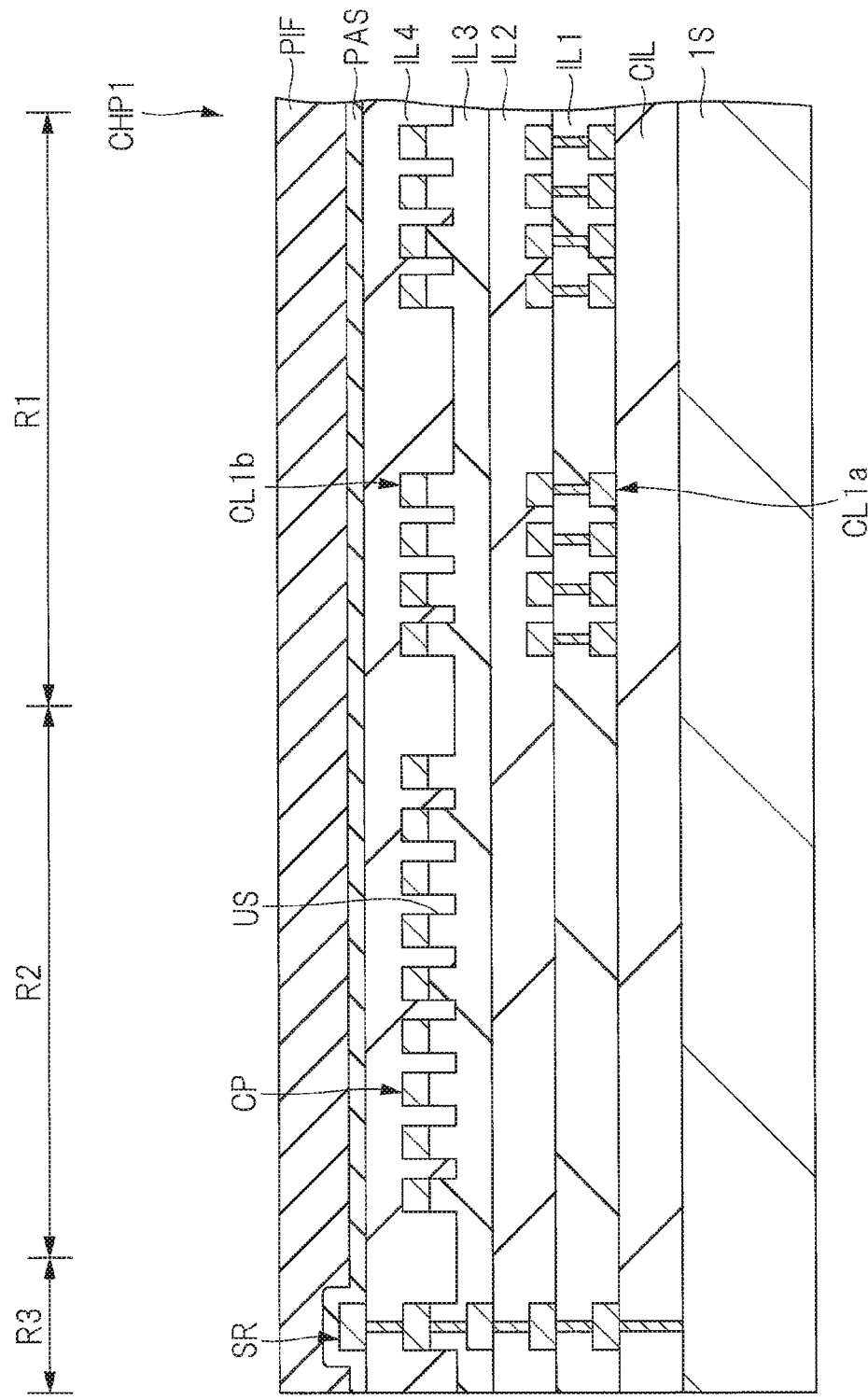
FIG. 11 is a cross-sectional view showing a schematic structure of the semiconductor chip according to a modification of the first embodiment.

FIG. 11 is a cross-sectional view showing a schematic structure of the semiconductor chip CHP1 of the present modification. As shown in FIG. 11, the unevennesses US in the present modification are formed between the interlayer insulating film IL3 and the interlayer insulating film IL4 rather than between the interlayer insulating film IL4 and the surface protective film PAS, and the coil CL1b and the conductive pattern CP are formed in the same layer on the interlayer insulating film IL3 rather than on the interlayer insulating film IL4. Therefore, the coil CL1b and the conductive pattern CP in the present modification are formed in an intermediate wiring layer rather than in the uppermost wiring layer as in the first embodiment. In other words, another wiring layer is provided above the wiring layer in which the coil CL1b and the conductive pattern CP are formed.

Here, the interlayer insulating film IL3 and the interlayer insulating film IL4 are made of the same types of films. Specifically, the interlayer insulating film IL3 is made of a silicon oxide film, and the interlayer insulating film IL4 is also made of a silicon oxide film.

<<Manufacturing Method of Semiconductor Device>>

The semiconductor chip CHP1 of the present modification is configured as described above, and the manufacturing method thereof will be described below with reference to the drawings.

Figure 12:
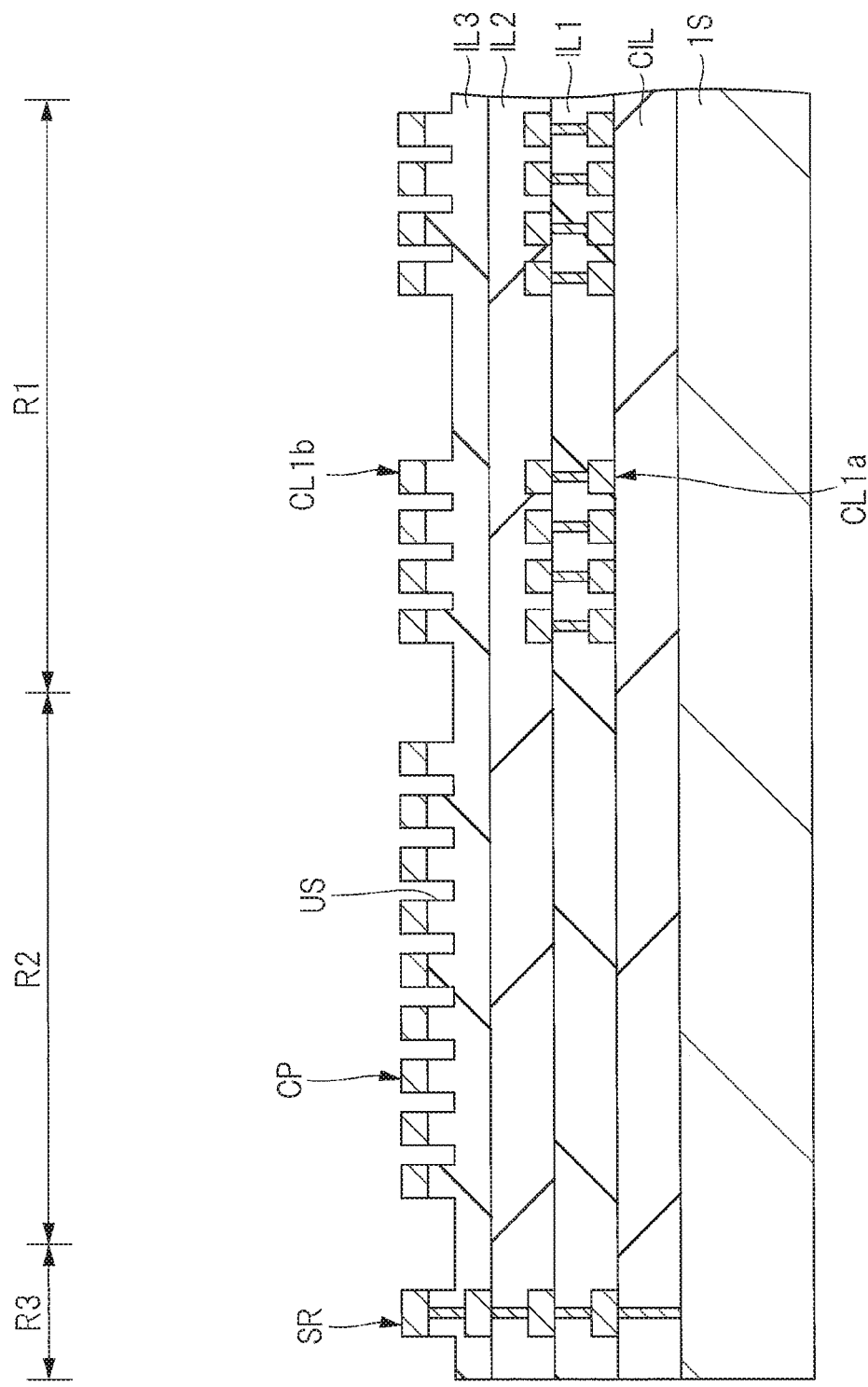
FIG. 12 is a cross-sectional view showing a manufacturing process of the semiconductor device according to the modification of the first embodiment.

First, as shown in FIG. 12, after the coil CL1b and the conductive pattern CP are formed in the same layer on the interlayer insulating film IL3 formed above the semiconductor substrate 1S, a portion of the interlayer insulating film IL3 that is exposed through the conductive pattern CP is etched with using the coil CL1b and the conductive pattern CP, which are formed in the same layer, as the hard mask. Hence, as shown in FIG. 12, the unevennesses US can be formed on a surface of the interlayer insulating film IL3.

Figure 13:
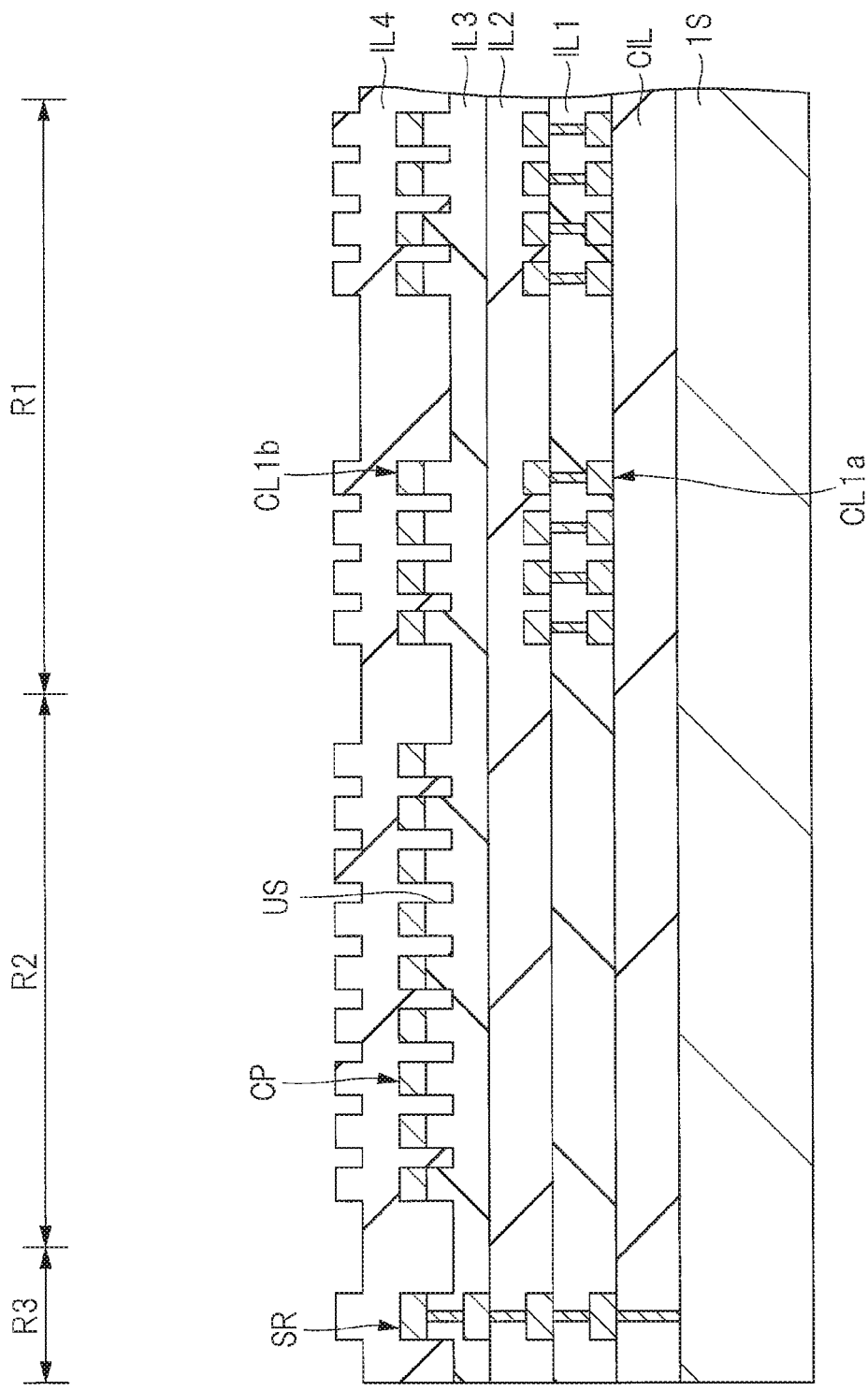
FIG. 13 is a cross-sectional view showing the manufacturing process of the semiconductor device continued from FIG. 12.

Next, as shown in FIG. 13, the interlayer insulating film IL4 is formed so as to cover the conductive pattern CP and the coil CL1b formed on the interlayer insulating film IL3 having the unevennesses formed therein. The interlayer insulating film IL4 is made of, for example, a silicon oxide film, and is formed by using, for example, the CVD process. At this time, as shown in FIG. 13, the surface of the interlayer insulating film IL4 has a shape that corresponds to the unevennesses US formed on the surface of the interlayer insulating film IL3 below the interlayer insulating film IL4.

Figure 14:
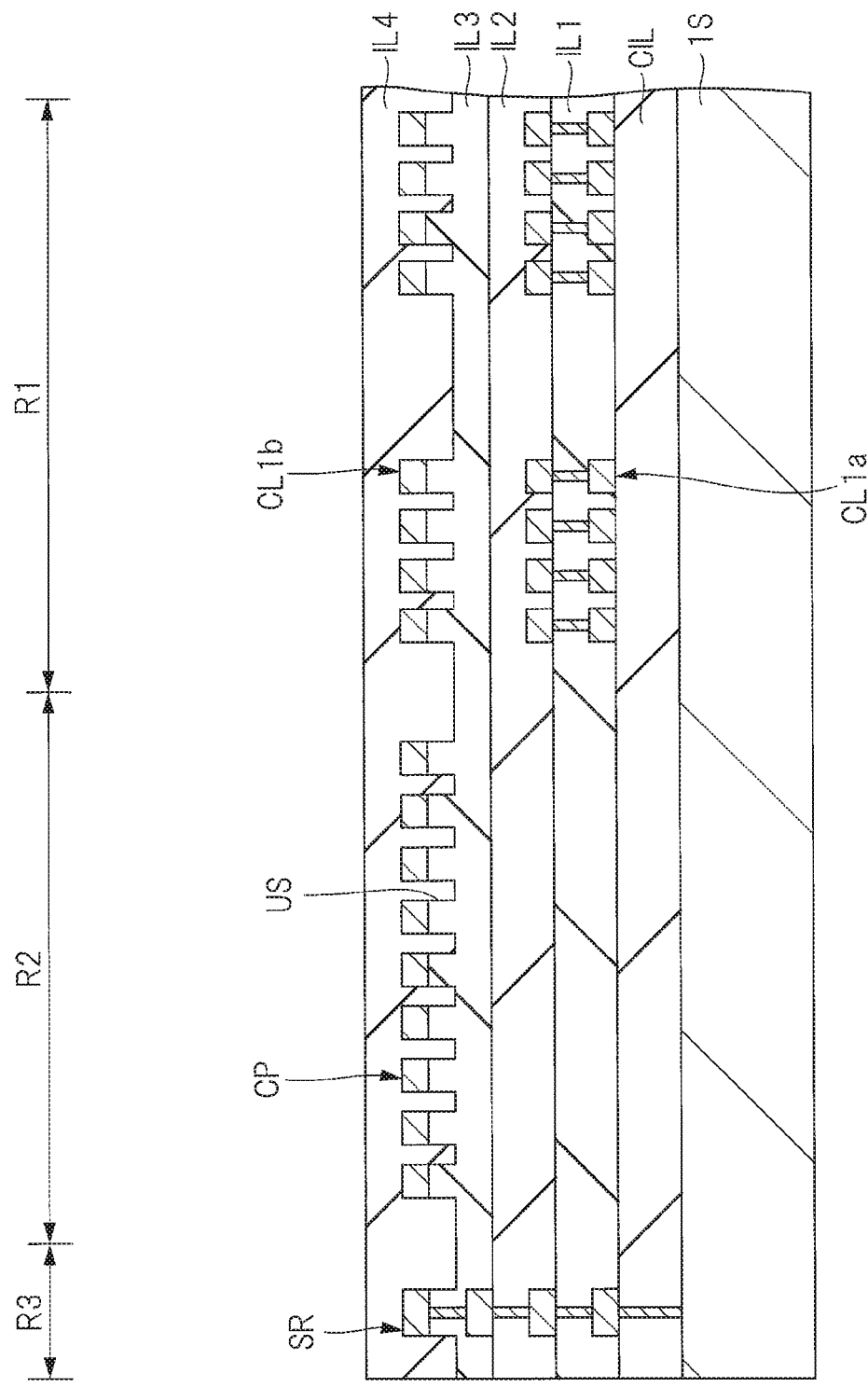
FIG. 14 is a cross-sectional view showing the manufacturing process of the semiconductor device continued from FIG. 13.
Figure 15:
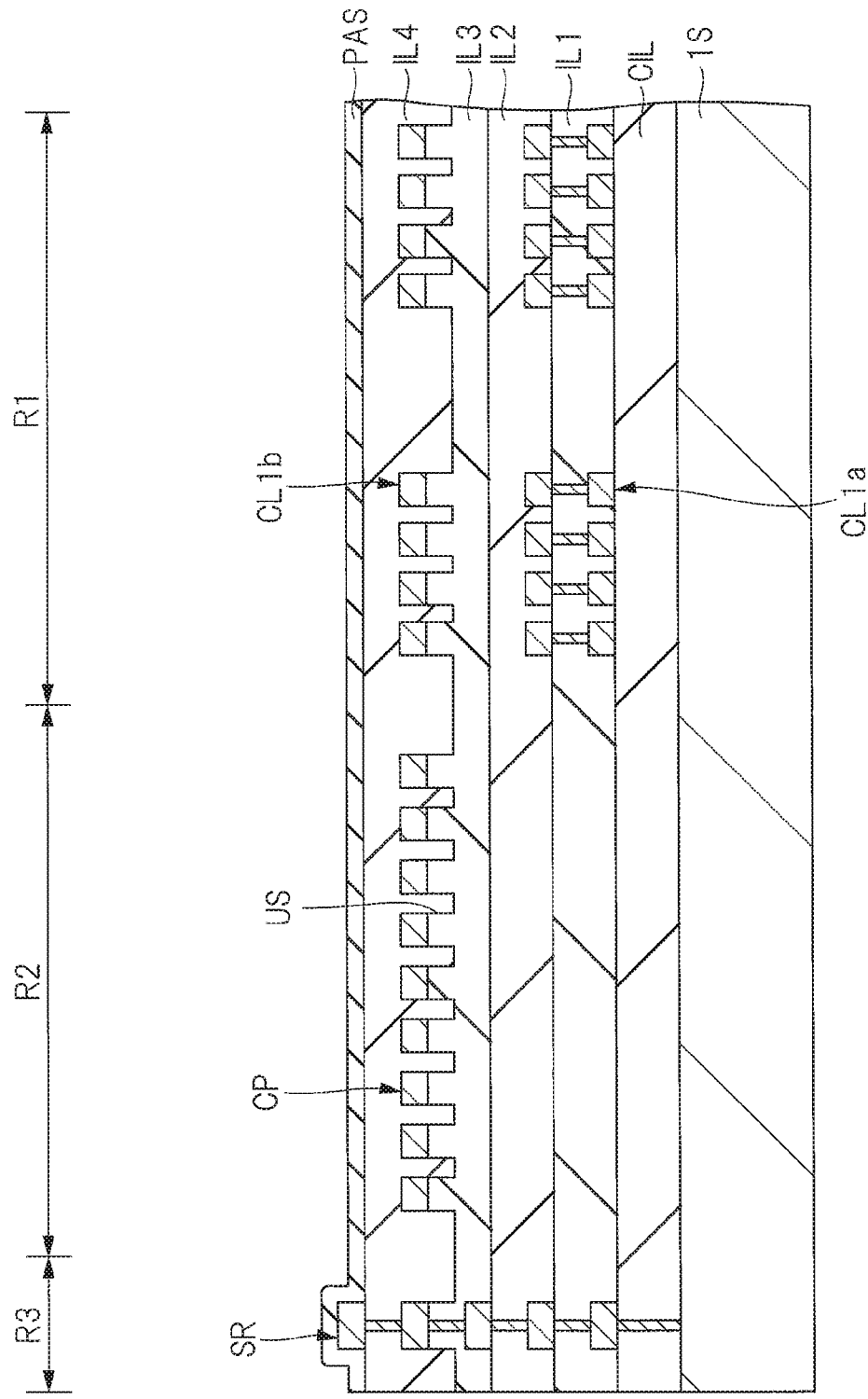
FIG. 15 is a cross-sectional view showing the manufacturing process of the semiconductor device continued from FIG. 14.

Thereafter, as shown in FIG. 14, the surface of the interlayer insulating film IL4 is planarized by using, for example, a chemical mechanical polishing process (CMP process). Then, as shown in FIG. 15, the surface protective film PAS made of, for example, a silicon nitride film is formed over the interlayer insulating film IL4 having the planarized surface. Descriptions of subsequent steps will be omitted as appropriate. Thus, the semiconductor device that includes the semiconductor chip CHP1 of the present modification can be manufactured in this manner.

Advantages of Modification

Since the present modification also includes the above-described first and second features of the first embodiment, a significant effect in which dielectric breakdown between the coil CL1b and the seal ring SR is suppressed while suppressing a decrease in manufacturing yield and an increase in manufacturing cost can be achieved.

Additionally, in the present modification, the following advantage can be achieved. Namely, in the manufacturing method of the semiconductor device of the present modification, the surface of the interlayer insulating film IL4 is planarized in a state where the coil CL1b and the conductive pattern CP are formed in the layer below the interlayer insulating film IL4 as shown in FIGS. 13 and 14. Although the surface of the interlayer insulating film IL4 is planarized through the CMP process, the so-called "dishing" in which a dent is formed on the surface of the interlayer insulating film IL4 located on the pattern having low density is caused by the CMP process depending on the difference in density of the pattern (coil CL1b and conductive pattern CP) formed in the underlying layer. In this regard, since the pattern is not formed in the layer below the interlayer insulating film IL4 within the region R2 if the conductive pattern CP is not formed within the region R2, the dishing tends to occur on the surface of the interlayer insulating film IL4 within the region R2. In contrast, in the present modification, the surface of the interlayer insulating film IL4 is planarized in the state where the coil CL1b and the conductive pattern CP are formed in the layer below the interlayer insulating film IL4 as shown in FIGS. 13 and 14. Namely, in the present modification, the surface of the interlayer insulating film IL4 is planarized in the state where the difference in density of the pattern formed in the lower layer is small. As a result, according to the present modification, surface flatness of the interlayer insulating film IL4 can be improved in the step of planarizing the interlayer insulating film IL4 by the CMP process.

Second Embodiment

In a second embodiment, improvements regarding the planar layout of the coil CL1b and the conductive pattern CP will be described with reference to the drawings.

Figure 16:
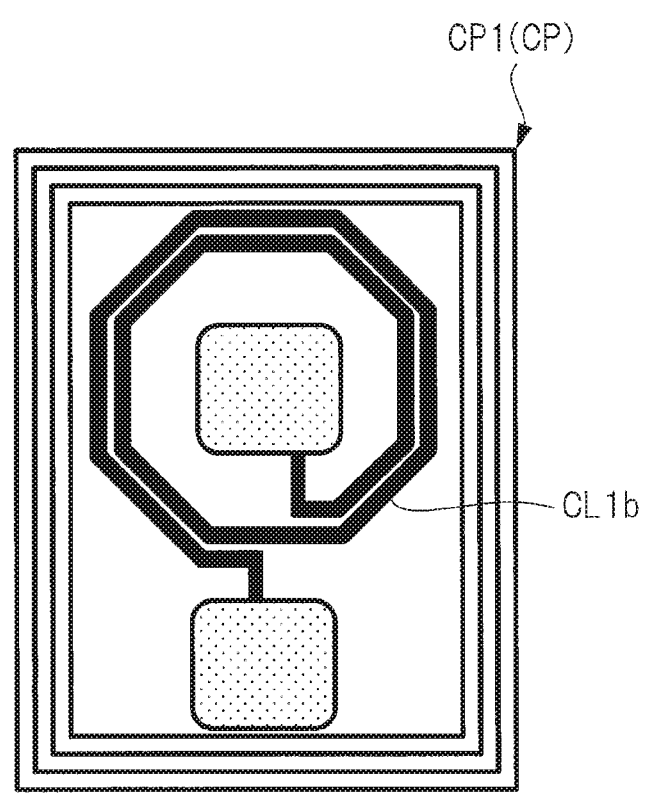
FIG. 16 is a schematic view showing a planar layout of a coil and a conductive pattern formed in the same layer according to a second embodiment of the present invention.

FIG. 16 is a schematic diagram showing a planar layout of the coil CL1b and the conductive pattern CP1 (CP) formed in the same layer in the second embodiment. As shown in FIG. 16, the conductive pattern CP1 is comprised of a closed pattern surrounding the coil CL1b (inductor) in plan view. Hence, the conductive pattern CP1 is formed in every direction with respect to the coil CL1b at the center. This means that the unevennesses are formed so as to match the conductive pattern CP1 surrounding the coil CL1b in every direction. As a result, according to the second embodiment, even if a seal ring to which a reference potential (0 V) is applied is present in any direction of the coil CL1b, the unevennesses formed so as to match the conductive pattern CP1 are always disposed between the coil CL1b and the seal ring. Hence, leakage current flowing between the coil CL1b to which a high potential is applied and the seal ring SR to which the reference potential (0 V) is applied can be reduced regardless of the direction in which the seal ring is provided with respect to an arrangement position of the coil CL1b. Therefore, according to the planar layout of the coil CL1b and the conductive pattern CP1 of the second embodiment, a withstand voltage between the coil CL1b and the seal ring SR can be improved. Hence, according to the second embodiment, reliability of the semiconductor device can be improved.

Additionally, the following advantages can also be achieved by forming the conductive pattern CP1 comprised of a closed pattern surrounding the coil CL1b. Specifically, according to the second embodiment, it is possible to improve the degree of freedom in the arrangement of the coil CL1b to which the high potential is applied. For example, although the arrangement position of the coil CL1b within the semiconductor chip depends on the layout design, if the conductive pattern CP1 is not comprised of a closed pattern surrounding the coil CL1b, there may be a case where a wiring pattern to which a different potential is applied is arranged in close proximity to the arrangement position of the coil CL1b in a direction in which the conductive pattern CP1 is not formed depending on the layout design. In this case, the possibility of dielectric breakdown between the coil CL1b to which the high potential is applied and the wiring pattern increases. In order to prevent such a situation, when the conductive pattern CP1 is not to be comprised of a closed pattern surrounding the coil CL1b, the layout needs to be designed such that the wiring pattern to which a different potential is applied is not arranged in close proximity to the coil CL1b in a direction in which the conductive pattern CP1 is not formed. This means that design rules need to be established in detail, which also means that the layout design tends to become complicated.

In contrast, when the conductive pattern CP1 is comprised of a closed pattern surrounding the coil CL1b as in the second embodiment, the coil CL1b at the center is equivalently surrounded in every direction. This means that an occurrence probability of dielectric breakdown can be infallibly reduced by merely providing a design rule stating that the wiring pattern to which a different potential is applied must be arranged at a predetermined distance from the arrangement position of the coil CL1b. In other words, according to the second embodiment, there is no need to consider the arrangement direction of the wiring pattern for preventing dielectric breakdown. This means that easiness of layout design is improved. Accordingly, efficiency of layout design can be improved, and thus, turnaround time (TAT) can be shortened. Therefore, according to the second embodiment, the manufacturing cost can be reduced by shortening the turnaround time.

First Modification

Figure 17:
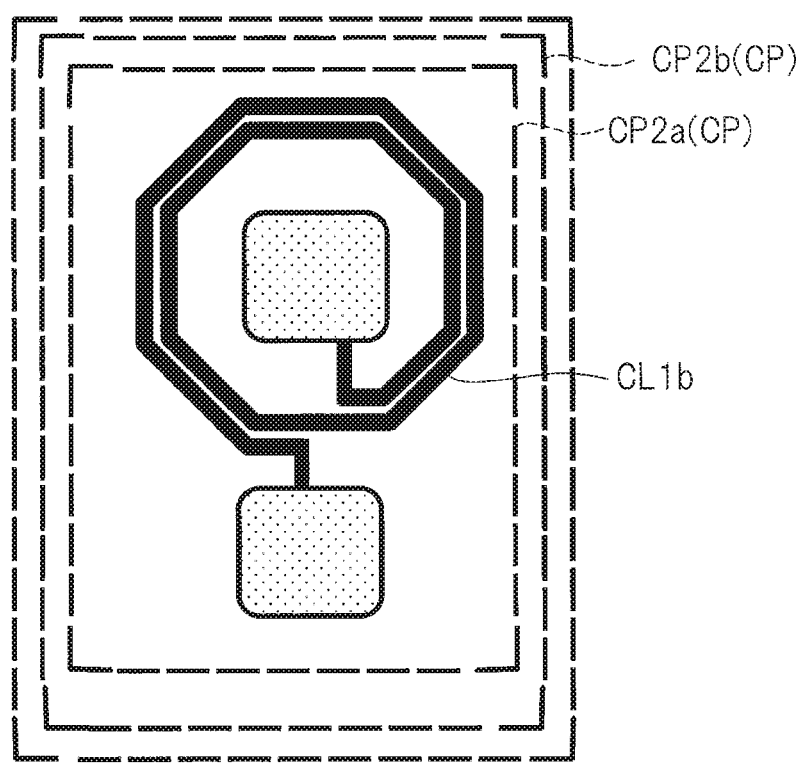
FIG. 17 is a schematic view showing a planar layout according to a first modification of the second embodiment.

Next, a first modification of the second embodiment will be described. FIG. 17 is a schematic view showing a planar layout of the coil CL1b and the conductive pattern CP formed in the same layer in the first modification. As shown in FIG. 17, the conductive pattern CP surrounding the coil CL1b includes a conductive pattern CP2a that has a plurality of gaps and surrounds the coil CL1b in plan view, and a conductive pattern CP2b that has a plurality of gaps and surrounds the conductive pattern CP2a in plan view.

According to the first modification configured as described above, an increase in noise at the coil CL1b can be suppressed. In other words, if the conductive pattern CP is comprised of a closed pattern surrounding the coil CL1b, a counter-electromotive force is generated in the conductive pattern CP by an electromagnetic induction phenomenon caused by a change in a magnetic flux generated by the coil CL1b, and the noise caused by this counter-electromotive force is presumably applied to the coil CL1b.

In contrast, according to the first modification, since neither the conductive pattern CP2a nor the conductive pattern CP2b constituting the conductive pattern CP is comprised of a closed pattern, superimposition of noise on the coil CL1b caused by the above-described mechanism can be suppressed. Further, in the first modification, the gaps formed on the conductive pattern CP2a and the gaps formed on the conductive pattern CP2b are alternately arranged.

Hence, according to the first modification, the gaps formed on the conductive pattern CP2a and the gaps formed on the conductive pattern CP2b are prevented from being arranged in alignment with each other. As a result, for example, the unevennesses can be suppressed from not being provided on a line segment connecting the coil CL1b and the seal ring, and thus, dielectric breakdown between the coil CL1b and the seal ring can be suppressed. In other words, according to the first modification, dielectric breakdown between the coil CL1b and the seal ring can be infallibly suppressed while preventing noise caused by the presence of the conductive pattern CP from being applied to the coil CL1b.

Second Modification

Figure 18:
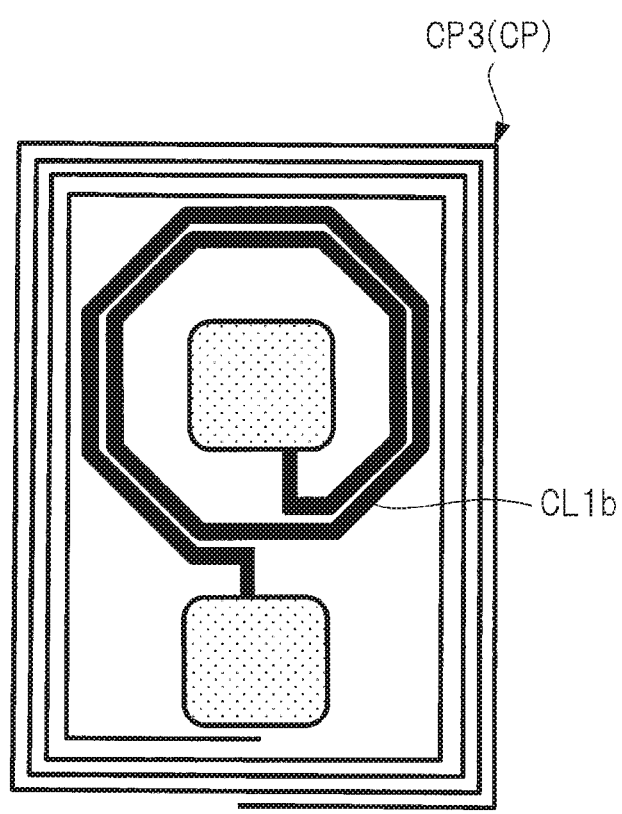
FIG. 18 is a schematic view showing a planar layout according to a second modification of the second embodiment.

Next, a second modification of the second embodiment will be described. FIG. 18 is a schematic view showing a planar layout of the coil CL1b and a conductive pattern CP3 (CP) formed in the same layer in the second modification. As shown in FIG. 18, the conductive pattern CP3 surrounding the coil CL1b is comprised of a spiral pattern surrounding the coil CL1b in plan view. In the conductive pattern CP3 configured as described above, the conductive pattern CP3 is not comprised of a closed pattern, and thus, the superimposition of noise on the coil CL1b caused by the above-described mechanism can be suppressed. In other words, according to the second modification, dielectric breakdown between the coil CL1b and the seal ring can be infallibly suppressed while preventing noise caused by the presence of the conductive pattern CP from being applied to the coil CL1b.

Third Embodiment

Next, a third embodiment will be described.

Figure 19:
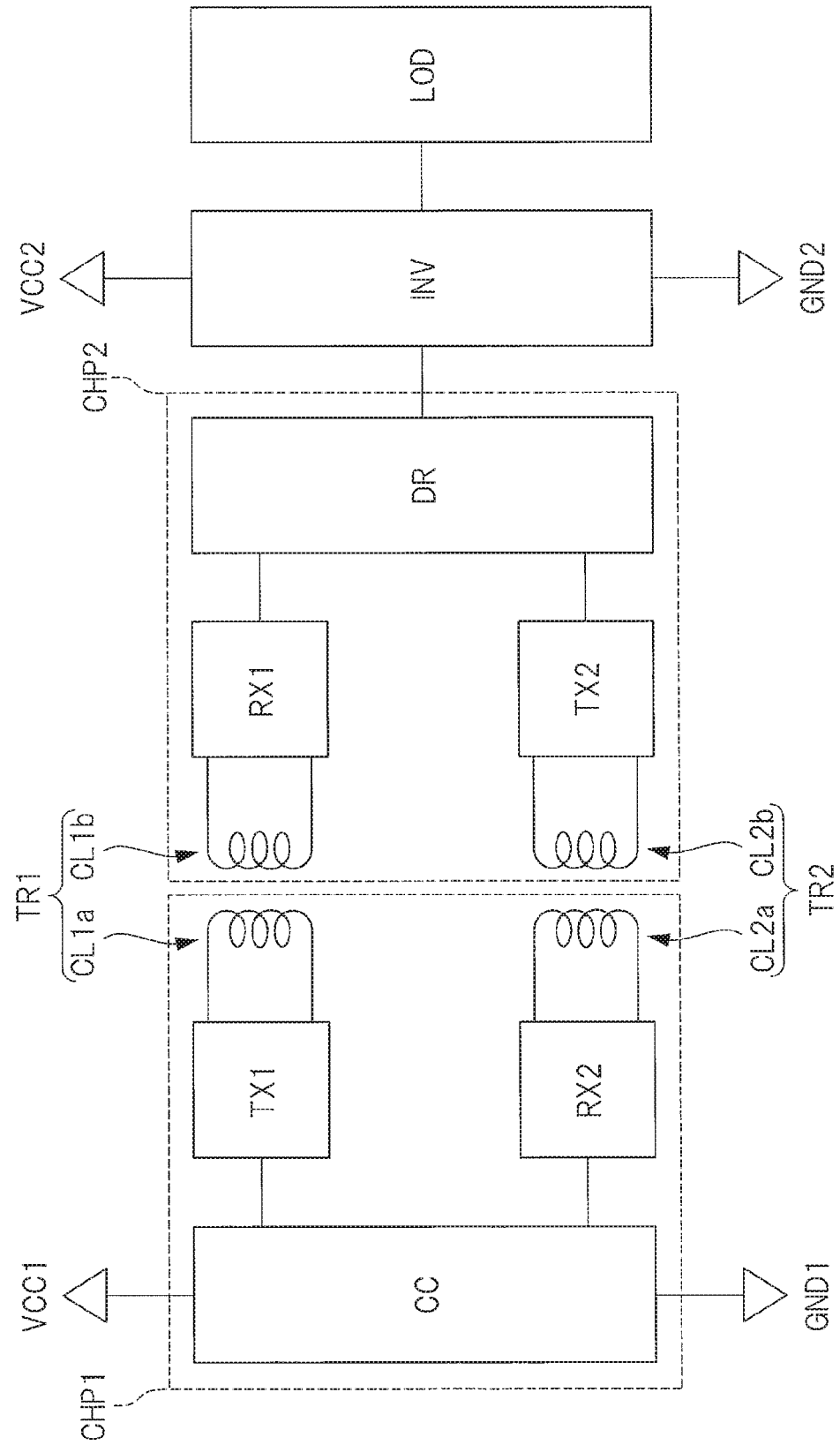
FIG. 19 is a diagram showing a configuration example of a drive control unit that drives a load.

FIG. 19 is a diagram showing a configuration example of the drive control unit in the third embodiment that drives the load such as a motor. As shown in FIG. 19, the drive control unit of the third embodiment includes the control circuit CC, the transformer TR1, the transformer TR2, the drive circuit DR, and the inverter INV, and the drive control unit is electrically connected with the load LOD. In particular, as shown in FIG. 19, the control circuit CC, the transmission circuit TX1, the coil CL1a partially constituting the transformer TR1, the reception circuit RX2, and the coil CL2a partially constituting the transformer TR2 are formed within the semiconductor chip CHP1 in the third embodiment. On the other hand, as shown in FIG. 19, the reception circuit RX1, the coil CL1b partially constituting the transformer TR1, the transmission circuit TX2, and the coil CL2b partially constituting the transformer TR2 are formed within the semiconductor chip CHP2 in the third embodiment.

Figure 20:
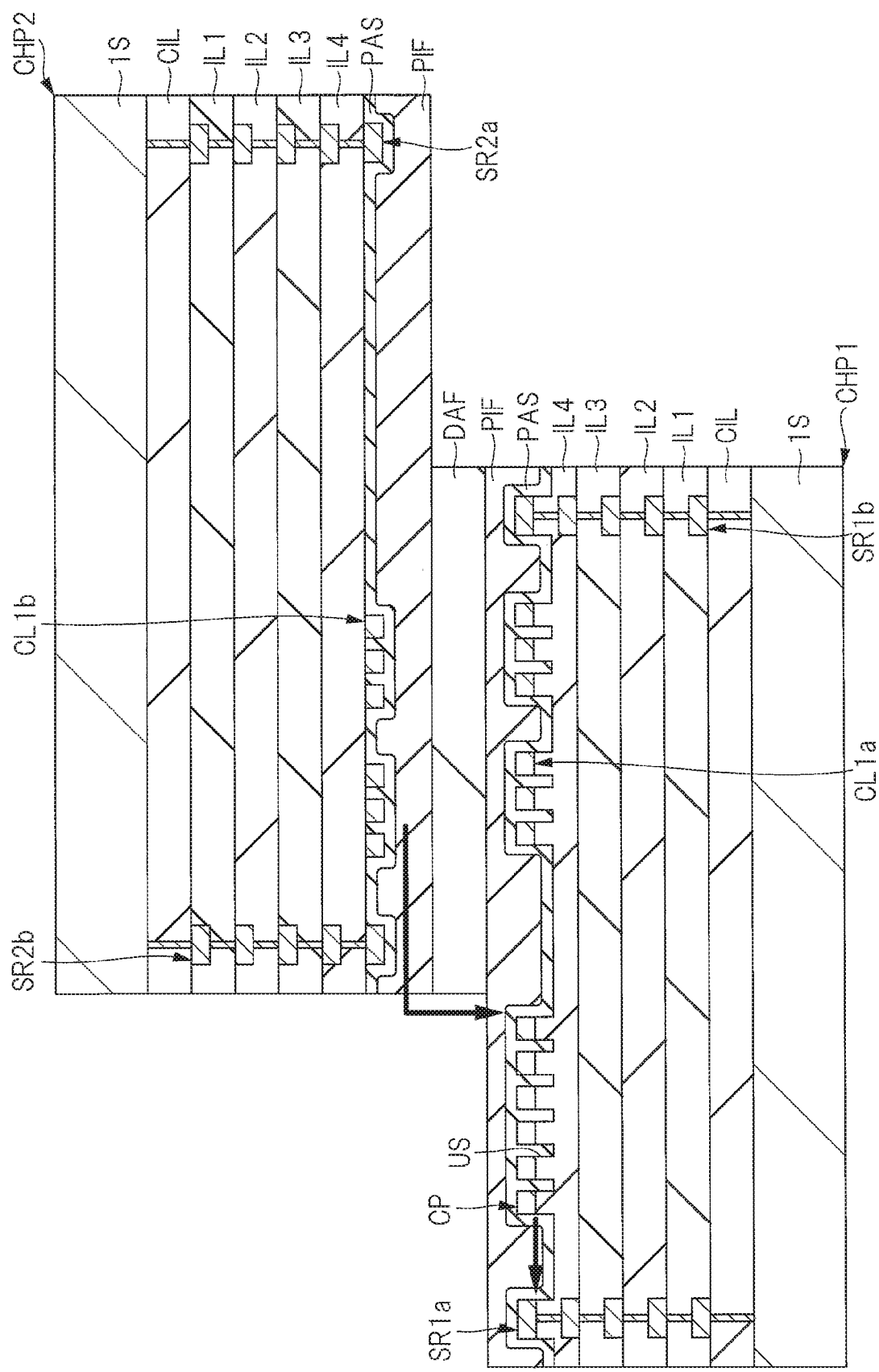
FIG. 20 is a cross-sectional view showing a schematic configuration of a semiconductor device according to a third embodiment of the present invention.

FIG. 20 is a cross-sectional view showing a schematic configuration of the semiconductor device of the third embodiment. As shown in FIG. 20, the semiconductor device of the third embodiment includes the semiconductor chip CHP2 stacked on the semiconductor chip CHP1 via a die-attach film DAF.

First, as shown in FIG. 20, in the semiconductor chip CHP1, the coil CL1a and the conductive pattern CP are formed in the same uppermost wiring layer, and the unevennesses US are formed so as to match the conductive pattern CP. Additionally, a seal ring SR1a is formed on the left end portion of the semiconductor chip CHP1, and a seal ring SR1b is formed on the right end portion of the semiconductor chip CHP1.

Next, as shown in FIG. 20, in the semiconductor chip CHP2, the coil CL1b is formed in the uppermost wiring layer. Additionally, a seal ring SR2b is formed on the left end portion of the semiconductor chip CHP2, and a seal ring SR2a is formed on the right end portion of the semiconductor chip CHP2.

In particular, in the semiconductor device of the third embodiment, the semiconductor chip CHP2 is stacked on the semiconductor chip CHP1 such that the coil CL1a formed within the semiconductor chip CHP1 and the coil CL1b formed within the semiconductor chip CHP2 can be inductively coupled to each other.

Here, in the third embodiment, the coil CL1a and the coil CL1b inductively coupled to each other are respectively formed within separate semiconductor chips (CHP1, CHP2). Thus, unlike the first embodiment, this semiconductor chip CHP1 does not have a configuration in which the coil CL1b to which a high potential is applied and the seal ring to which a reference potential (0 V) is applied are provided (see FIG. 4). In other words, in the configuration of the semiconductor device of the third embodiment, since the coil CL1a formed within the semiconductor chip CHP1 is a coil to which a low potential is applied, dielectric breakdown between this coil CL1a and the seal ring to which the reference potential (0 V) is applied does not become apparent as a problem.

However, studies by the present inventors have found that leakage current flows between the seal ring SR1a which is formed within the semiconductor chip CHP1 and to which the reference potential (0 V) is applied and the coil CL1b which is formed within the semiconductor chip CHP2 and to which the high potential (the reference potential (600 V)+a predetermined voltage) is applied, via a leakage path extending through an end portion of the semiconductor chip CHP2 indicated by bold arrows shown in FIG. 20. Therefore, as shown in FIG. 20, a technical significance to adopt a technical idea of providing the unevennesses formed so as to match the conductive pattern CP formed in the same layer as the coil CL1a resides in the semiconductor device of the third embodiment from the viewpoint of suppressing dielectric breakdown between the coil CL1b formed within the semiconductor chip CHP2 and the seal ring SR1a formed within the semiconductor chip CHP1. In other words, the technical idea of the first embodiment is not only useful for the semiconductor device in the first embodiment but is also useful for the semiconductor device in the third embodiment. In particular, since the structure shown in FIG. 20 has the unevennesses US formed between the interlayer insulating film (silicon oxide film) IL4 and the surface protective film (silicon nitride film) PAS, it is effective when the interface between the interlayer insulating film (silicon oxide film) IL4 and the surface protective film (silicon nitride film) PAS serves as a main leakage path.

Note that, in FIG. 20, the withstand voltage between the coil CL1b formed within the semiconductor chip CHP2 and the seal ring SR2b also formed within the semiconductor chip CHP2 does not become apparent as a problem. This is because since the (high-side) reference potential within the semiconductor chip CHP2 is, for example, 600 V instead of 0 V and "the reference potential (600 V)+a predetermined voltage" is applied to the coil CL1b, a potential difference between the seal ring SR2b and the coil CL1b is relatively small and would not become apparent as a problem when compared to the potential difference between the coil CL1b and the seal ring SR1a.

Modification

Next, a modification of the third embodiment will be described.

Figure 21:
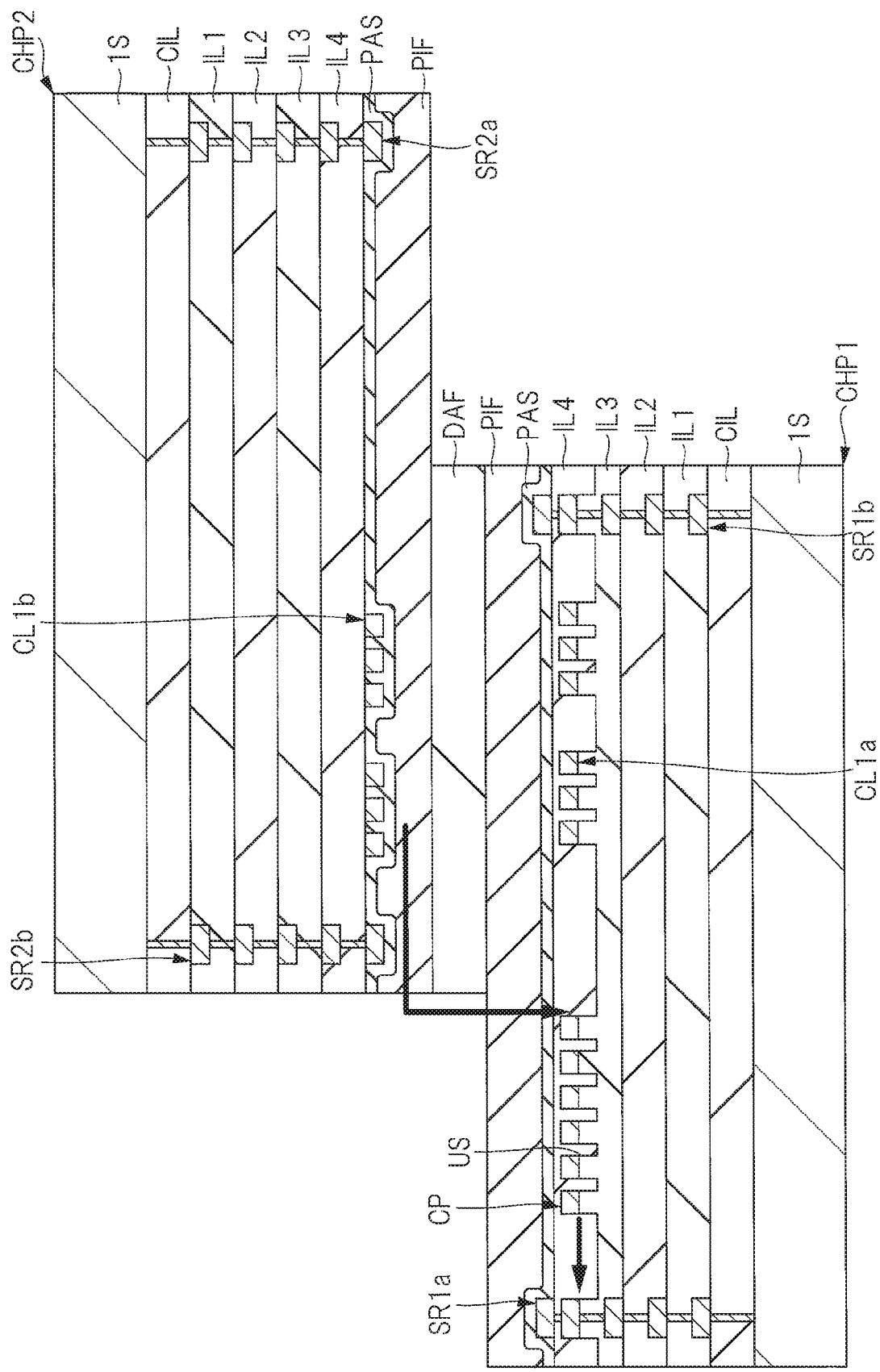
FIG. 21 is a cross-sectional view showing a schematic configuration of the semiconductor device according to a modification of the third embodiment.

FIG. 21 is a cross-sectional view showing a schematic configuration of a semiconductor device of the present modification. In the modification shown in FIG. 21, the coil CL1a and the conductive pattern CP are formed in the same wiring layer located below the uppermost wiring layer rather than in the uppermost wiring layer within the semiconductor chip CHP1.

The semiconductor device of the present modification configured as described above is effective from the viewpoint of suppressing the dielectric breakdown which occurs when leakage current flows between the seal ring SR1a formed within the semiconductor chip CHP1 and the coil CL1b formed within the semiconductor chip CHP2 via the leakage path that extends through the end portion of the semiconductor chip CHP2 as indicated by bold arrows. In other words, since the unevennesses US in the present modification are formed between the interlayer insulating film (silicon oxide film) IL3 and the interlayer insulating film (silicon oxide film) IL4, it is effective when the interface between the interlayer insulating film (silicon oxide film) IL3 and the interlayer insulating film (silicon oxide film) IL4 serves as a main leakage path.

In the foregoing, the invention made by the present inventors has been concretely described based on the embodiments. However, it is needless to say that the present invention is not limited to the foregoing embodiments, and various modifications and alterations can be made within the scope of the present invention.

What is claimed is:

1. A semiconductor device that allows signal transmission by using inductive coupling, comprising:
    a first semiconductor chip including:
        a first interlayer insulating film;
        a wiring layer formed over the first interlayer insulating film;
        a second interlayer insulating film formed over the first interlayer insulating film so as to cover the wiring layer;
        a first inductor formed in the wiring layer; and
        a conductive pattern formed in the wiring layer,
    wherein unevennesses are formed between the first interlayer insulating film and the second interlayer insulating film,
    the unevennesses include convex portions and concave portions that are adjacent to one another,
    the conductive pattern is arranged on each of the convex portions, and
    the conductive pattern has at least one of (a) a same profile as the convex portions and (b) sidewalls that are coplanar with sidewalls of the convex portions.

2. The semiconductor device according to claim 1, wherein the first interlayer insulating film and the second interlayer insulating film are made of different types of films.

3. The semiconductor device according to claim 2, wherein the first interlayer insulating film is a silicon oxide film; and
    the second interlayer insulating film is a silicon nitride film.

4. The semiconductor device according to claim 1, wherein a relation of w<h×2 is satisfied, where "w" denotes a width of an upper surface of the convex portion, and "h" denotes a height from a bottom surface of the concave portion to the upper surface of the convex portion.

5. The semiconductor device according to claim 1, wherein the first semiconductor chip includes a lower wiring layer located below the wiring layer, and a second inductor capable of being inductively coupled to the first inductor is formed in the lower wiring layer.

6. The semiconductor device according to claim 1, further comprising a second semiconductor chip, wherein a second inductor capable of being inductively coupled to the first inductor formed within the first semiconductor chip is formed within the second semiconductor chip.

7. The semiconductor device according to claim 1, wherein the wiring layer is an uppermost wiring layer.

8. The semiconductor device according to claim 1, wherein another wiring layer is provided above the wiring layer.

9. The semiconductor device according to claim 1, wherein the first inductor is formed within a first region of the first semiconductor chip, the conductive pattern is formed within a second region of the first semiconductor chip, and the second region is a region sandwiched between an end portion of the first semiconductor chip and the first region in cross-sectional view.

10. The semiconductor device according to claim 1, wherein the first semiconductor chip includes:
a first region in which the first inductor is formed;
a second region in which the conductive pattern is formed; and
a third region in which a seal ring is formed, and
the second region is a region sandwiched between the first region and the third region in cross-sectional view.

11. The semiconductor device according to claim 1, wherein the conductive pattern is a closed pattern surrounding the first inductor in plan view.

12. The semiconductor device according to claim 1, wherein the conductive pattern includes, in plan view:
a first pattern that has a plurality of gaps and surrounds the first inductor; and
a second pattern that has a plurality of gaps and surrounds the first pattern.

13. The semiconductor device according to claim 12, wherein the gaps formed within the first pattern and the gaps formed within the second pattern are alternately arranged to each other.

14. The semiconductor device according to claim 1, wherein the conductive pattern is a spiral pattern surrounding the first inductor in plan view.

15. The semiconductor device according to claim 1, wherein a potential of the conductive pattern is a floating potential.

16. The semiconductor device according to claim 1, wherein the first interlayer insulating film and the second interlayer insulating film are made of the same type of film.

17. The semiconductor device according to claim 16, wherein the first interlayer insulating film is a silicon oxide film, and
the second interlayer insulating film is also a silicon oxide film.

18. The semiconductor device according to claim 1, wherein directly adjacent pairs of the convex portions and the concave portions extend comprise a same width between the first interlayer insulating film and the second interlayer insulating film.

* * * * *